United States Patent
Saiki

(10) Patent No.: US 6,606,146 B2
(45) Date of Patent: Aug. 12, 2003

(54) STAGE DEVICE, EXPOSURE APPARATUS INCORPORATING THE STAGE DEVICE, AND METHOD OF USING THE SAME

(75) Inventor: Kazuaki Saiki, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/824,061

(22) Filed: Apr. 3, 2001

(65) Prior Publication Data

US 2001/0027595 A1 Oct. 11, 2001

(30) Foreign Application Priority Data

Apr. 11, 2000 (JP) ........................................ 2000-109833

(51) Int. Cl.⁷ .................. G03B 27/58; G03B 27/42; G03B 27/32; G01B 11/02; G01N 21/86
(52) U.S. Cl. .............................. 355/72; 355/53; 355/67; 355/77; 356/356; 356/358; 356/363; 250/548
(58) Field of Search ............................. 355/53, 67, 72, 355/77; 356/356, 358, 363; 250/548

(56) References Cited

U.S. PATENT DOCUMENTS

| 5,208,497 A | 5/1993 | Ishii et al. | |
| 5,473,410 A | 12/1995 | Nishi | |
| 5,528,118 A | 6/1996 | Lee | |
| 5,623,853 A | 4/1997 | Novak et al. | |
| 5,844,666 A | 12/1998 | Van Engelen et al. | 355/72 |
| 5,874,820 A | 2/1999 | Lee | 318/575 |
| 5,953,105 A | 9/1999 | Van Engelen et al. | 355/53 |
| 6,246,204 B1 | 6/2001 | Ebihara et al. | |
| 6,252,314 B1 * | 6/2001 | Itoh | |
| 6,262,794 B1 * | 7/2001 | Miyajima | |
| 6,285,457 B2 * | 9/2001 | Ukaji | |
| 6,329,780 B1 * | 12/2001 | Ebihara et al. | |

FOREIGN PATENT DOCUMENTS

JP 9-320956 A 12/1997

* cited by examiner

*Primary Examiner*—Frank G. Font
*Assistant Examiner*—Khaled Brown
(74) *Attorney, Agent, or Firm*—Oliff & Berridge PLC

(57) ABSTRACT

A stage device, usable in, e.g., an exposure apparatus, can include an inexpensive passive type vibration control pad system, while avoiding problems such as contact between stationary and movable parts and deterioration of stage control performance. The stage device includes a stage main body that moves on a base, and a support that is vibrationally isolated from the base. A movable part is disposed on the stage main body. A stationary part is supported by the support, the movable part moving relative to the stationary part. A detector detects a size of a gap between the movable part and the stationary part. An actuator adjusts a relative positional relationship between the movable part and the stationary part based on the detected gap size.

49 Claims, 12 Drawing Sheets

STAGE DEVICE, EXPOSURE APPARATUS INCORPORATING THE STAGE DEVICE, AND METHOD OF USING THE SAME

INCORPORATION BY REFERENCE

The disclosure of the following priority application is incorporated herein by reference in its entirety: Japanese Patent Application No. 2000-109833 filed Apr. 11, 2000.

BACKGROUND OF THE INVENTION

1. Field of Invention

This invention relates to a stage device in which a stage main body holding an object moves within a plane over a base, and to an exposure apparatus that performs an exposure process using a substrate held as the object on this stage device. In particular, the invention relates to a stage device and an exposure apparatus using a lithography process to manufacture a micro-device, such as, e.g., a liquid crystal display device or a semiconductor device.

2. Description of Related Art

Conventionally, various exposure apparatus are used to fabricate a semiconductor device, a liquid crystal display device, or the like by a photolithographic process. Recently, as exposure apparatus for fabricating a liquid crystal display panel (LCD panel) have become large, a unity-magnification batch transfer method in which exposure is possible over a large area or a step-and-scan type scanning projection exposure apparatus have been widely used.

In a step-and-scan type exposure apparatus for fabricating, for example, a liquid crystal display device, a reticle (mask) and a glass substrate are respectively held by stage devices. The reticle and the glass substrate are simultaneously, synchronously moved in one direction (the scanning direction) with respect to a projection optical system, and a reticle pattern is projected and exposed to each shot region on the glass substrate via the projection optical system.

FIG. 14 is an external perspective view showing one example of this type of stage device.

A stage device 1 shown in FIG. 14 is schematically constituted by a base (table) 2 that is supported by four vibration control pads 9, a stage (stage main body) 4 that is guided by an air guide 3 arranged on the base 2 and is freely moved in a Y-direction, which is the scanning direction, and a linear motor 5 that is controlled to drive the stage 4 in the Y-direction.

The linear motor 5 is constituted by linear motor movable parts 6 that protrude from both sides of the stage 4 in the X-direction, and linear motor stationary parts 8, having a U-shaped cross-section, arranged at a predetermined interval from each other in the X-direction so as to sandwich the respective movable parts 6. The stationary parts are arranged on reaction frames 7. The stage 4 is driven as the movable parts 6 move in the Y-direction due to a thrust generated between the movable parts 6 and the stationary parts 8, in a state that maintains a predetermined gap size with respect to the stationary parts 8,. Furthermore, the reaction frames 7 are vibrationally isolated from the base 2. Accordingly, the reaction force generated by acceleration and deceleration of the stage 4 is transmitted to the reaction frames 7 via the stationary parts 8. The provision of the reaction frame(s) prevents vibration of the stage 4 and of a projection optical system (not shown), which is mounted to the base 2, and prevents positional discrepancy of a reticle or a glass substrate held on the stage 4 because the reaction force is not transmitted to the base 2.

Furthermore, when the stage 4 moves, a position of the center of gravity of the stage device 1 changes. This causes a load applied to each of the vibration control pads 9 to change, such that a different load is applied to each of the vibration control pads 9. Because of this, the base 2 can become inclined because a height of each of the vibration control pads 9 is not the same (they are not equal to each other).

Meanwhile, even if the stage 4 moves and the base 2 is inclined, the stationary part 8 on the reaction frame 7 is not inclined (because it is mounted on the reaction frame 7). Therefore, there is a possibility that changes may occur in the size of the gap between each movable part 6 and its respective stationary part 8 such that these two parts may contact each other. Therefore, conventionally, when unequal loads are applied to the vibration control pads 9, in order to constantly maintain the base 2 in a horizontal orientation, an active type vibration control pad, having, for example, a voice coil motor, needed to be used. Such active type vibration control pads applied a counter-force to the base 2 in order to maintain the base horizontal.

However, the following problems exist in a conventional stage device and exposure apparatus having an active type vibration control pad system.

An active type vibration control pad system is provided with, for example, an air mount with a controllable internal pressure, or an actuator such as a voice coil motor, a piezoelectric element, or the like. In addition, the system is structured so as to control a posture of the base 2 by driving the voice coil motor or the like based on, for example, measurement values obtained from six accelerometers fixed to a main frame.

Conventionally, six degrees-of-freedom active control is performed, and four or more support points (pads) are provided for the vibration control pad system. Because the stage device is very heavy, the control pad system must withstand a load of several tons. Thus, in addition to having a complicated structure of the vibration control pad itself compared to the passive type, there are problems such that various devices such as an accelerator, a controller, and the like are needed. This causes the price of the vibration control pad system to be very high. Additionally, the amount of tooling for arrangement and adjustment increases, so there is also a problem in that the cost of the stage device and the exposure apparatus significantly increases. Additionally, due to effects of floor movement characteristics, there also is a problem of instability of movement.

Meanwhile, in the linear motor 5 that drives the stage 4, it has been determined that a unique fluctuation, which is called "thrust rippling", included in thrust, can significantly affect position-speed controllability of the stage 4. This thrust rippling is a function of the driving thrust generated by a driving amplifier, viscosity generated by the linear motor, the amplitude which is unique to individual linear motors, and the like. Recently, by considering the affect of thrust rippling, the driving of the linear motor is appropriately controlled so as to cancel the effects of thrust rippling.

However, in the linear motor 5, a change in the size of a gap between the movable part 6 and the stationary part 8 (as described above) also changes the thrust rippling. Therefore, even if thrust rippling that is initially generated is considered and the driving of the stage is appropriately controlled, a predetermined control capability cannot be obtained, and there is a possibility that there may be a negative effect on position-speed controllability of the stage.

SUMMARY OF THE INVENTION

This invention reflects on the above-mentioned problems. An object of this invention is to provide a stage device and an exposure apparatus that do not cause any problems such as deterioration of stage control capability, contact between a stationary part and a movable part, or the like, even if an inexpensive passive type of vibration control pad system is used.

A stage device according to one aspect of this invention includes a stage main body that moves on a base and a support that is vibrationally isolated from the base. The stage device includes a movable part disposed on the stage main body that moves relative to a stationary part that is supported by the support. A detector detects the size of a gap between the movable part and the stationary part, and an actuator adjusts a relative positional relationship between the stationary part and the movable part based on the detected size of the gap. The stage device can hold a mask (reticle) and/or a substrate (glass plate, semiconductor wafer, etc.).

In the stage device according to this aspect of the invention, as the stage main body moves on the base, if the base is inclined, the stage main body and the movable part are also inclined. However, because the stationary part is supported by the support, which is vibrationally isolated from the base, a size of the gap between the movable part and the stationary part changes. However, if this change in gap size is detected by the detector, the actuator can be controlled to adjust a relative positional relationship between the movable part and the stationary part, and the size of the gap therebetween can be returned to a predetermined value.

If the detector is disposed on the stationary part, the gap size needs to be detected by disposing detectors in a movable range of the movable part. Therefore, it is preferable that the detector is disposed on the movable part. Additionally, because the weight of the stationary part is approximately several tens of kilograms, whereas the weight of the stage main body including everything it is supporting is approximately several hundred kilograms, it is preferable that the actuator drives the stationary part.

The stage device can be used in an exposure apparatus in which the stage device is used as a mask stage or as a substrate stage. The exposure apparatus also could use one stage device of this invention as a mask stage and another stage device of this invention as a substrate stage.

Therefore, in an exposure apparatus according to one aspect of this invention, prior to performing exposure, when at least one of the mask stage and the substrate stage moves, even if the bases are inclined and a gap size between the movable parts and the stationary parts changes, actuators adjust a relative positional relationship between the movable parts and the stationary parts, and a gap size between these elements can be returned to a predetermined value.

BRIEF DESCRIPTION OF THE DRAWINGS

The invention will be described with reference to the following drawings in which like elements are identified by like reference numerals and wherein:

FIG. 12 is a perspective view showing a substrate stage device of another embodiment of this invention;

DETAILED DESCRIPTION OF PREFERRED EMBODIMENTS

Figure 14:
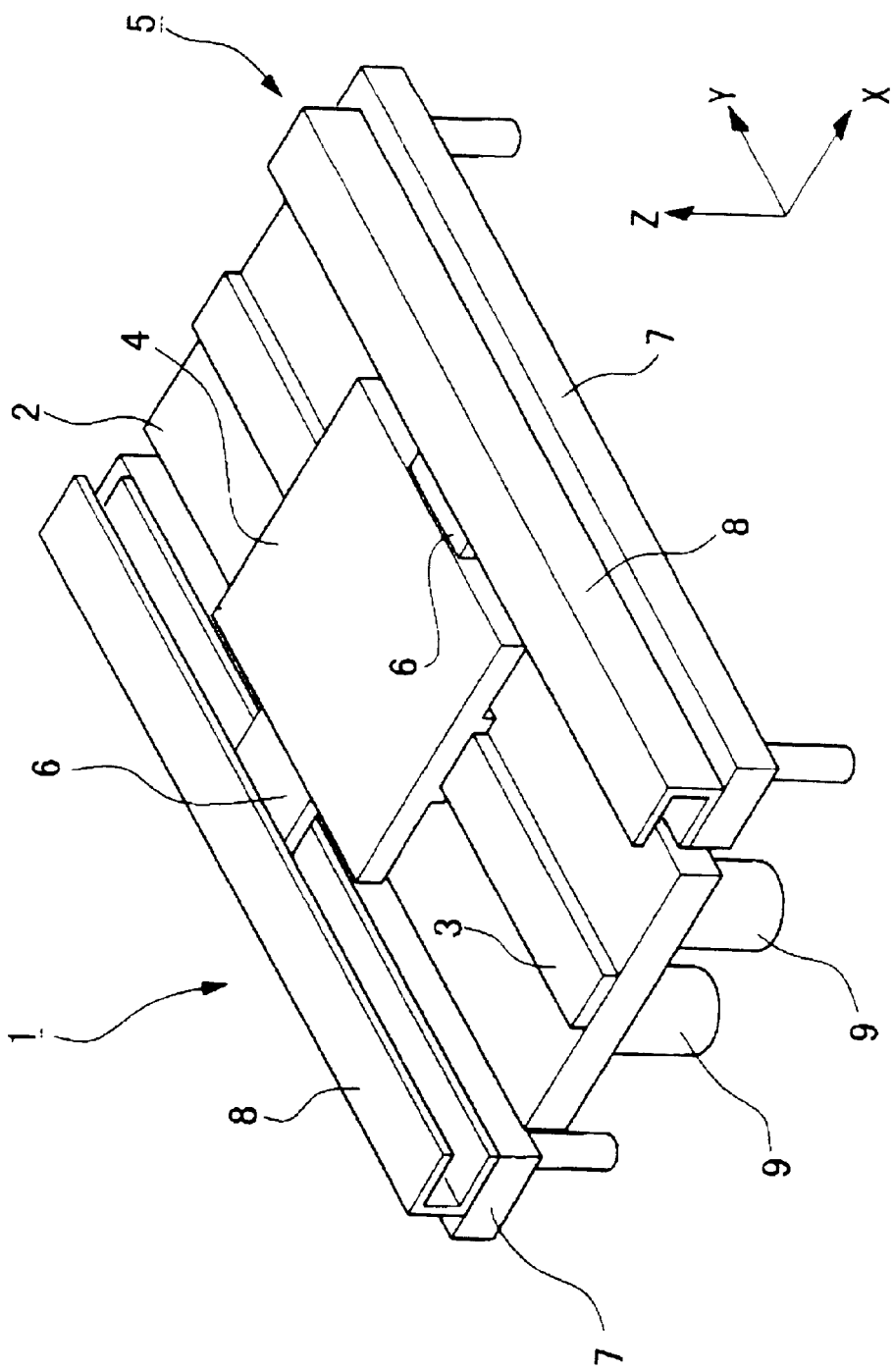
FIG. 14 is a perspective view showing one example of a conventional stage device.

The following explains a first embodiment of a stage device and an exposure device of this invention with reference to FIGS. 1–8. Here, an example is used in which the stage device of this invention is applied to a scanning type exposure apparatus that exposes, for example, a reticle pattern of a mask using a scanning method onto a substrate such as, for example, a square-shaped substrate. Furthermore, in this exposure apparatus, the stage device of this invention can be applied to both a reticle stage (mask stage) that holds and moves a reticle and to a substrate stage that holds and moves a glass substrate. In these drawings, the same symbols are applied to the same structural elements as in FIG. 14, which is a conventional example, and the explanation of those elements is omitted.

Figure 1:
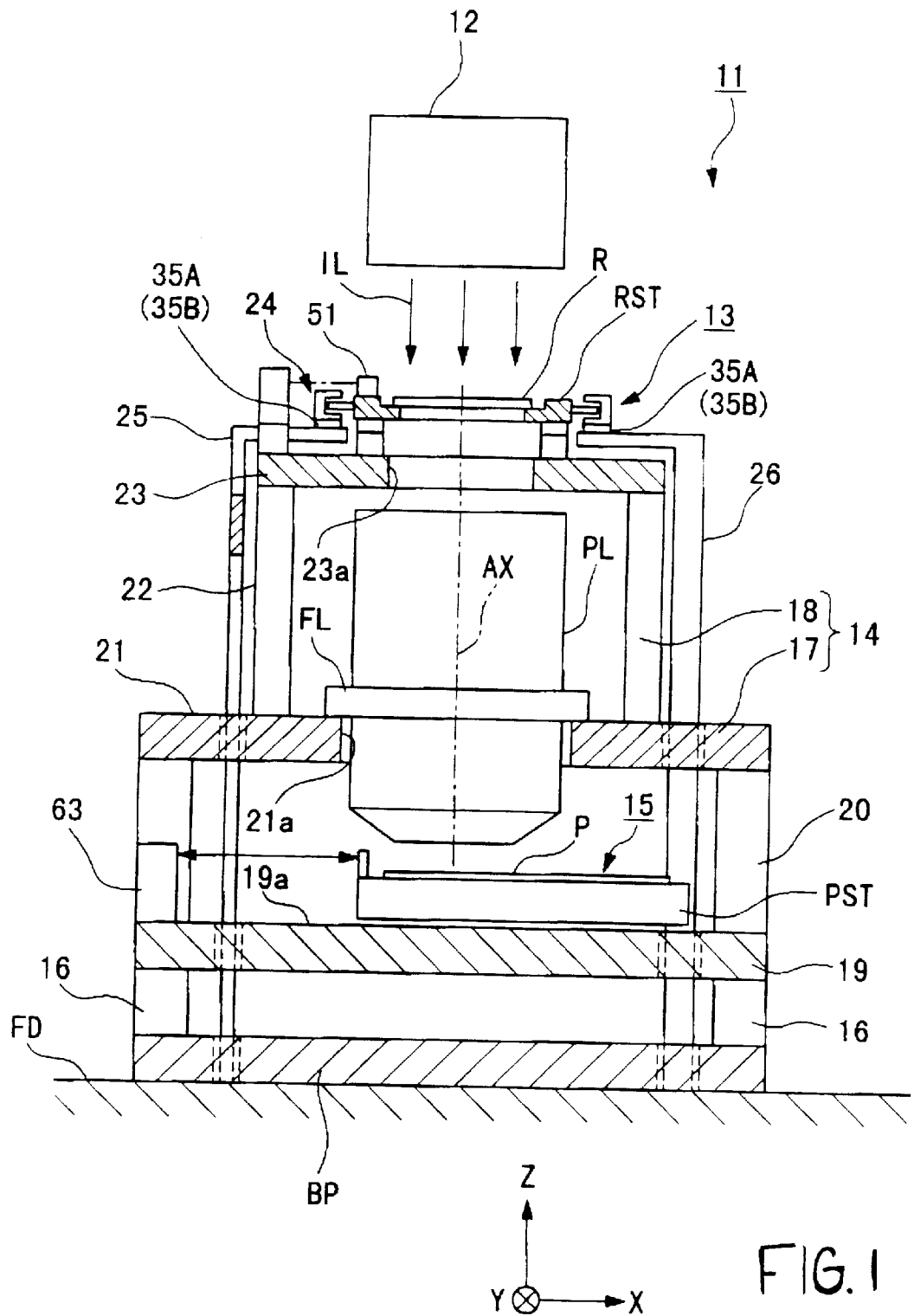
FIG. 1 is a schematic structural diagram of an exposure apparatus having stage devices according to a first embodiment of this invention.

FIG. 1 is a schematic structural diagram of an exposure apparatus 11 according to this invention. This exposure apparatus 11 is provided with an illumination optical system 12, a reticle stage device (stage device) 13 that holds and moves a reticle (mask, a mounted object) R, a projection optical system PL, a main body column 14 that holds the projection optical system PL, a substrate stage device (stage device) 15 that holds and moves a glass substrate (substrate, a mounted object) P, and the like.

For example, as disclosed in Japanese Laid-Open Patent Application No. 9-320956, an illumination optical system 12 is constituted by a light source unit, a shutter, a secondary light-source forming optical system, a beam splitter, a light-collecting lens system, a reticle blind, an imaging lens system (all undepicted), and the like. The illumination light IL illuminates a rectangular (or arcuate) illumination region on the reticle R, which is held in the reticle stage device 13, having uniform illuminance.

The main body column 14 is constituted by a first column 17 that is held via a plurality of vibration control pads 16 (four vibration control pads total, but only two vibration control pads are depicted in the front surface side of FIG. 1) on a base plate BP, which is a reference surface mounted on a floor FD, and a second column 18 arranged on the first column 17. Passive type vibration control pads 16 are provided that use an elastic material such as rubber or the like as a damping material.

The first column 17 is substantially horizontally supported by the four vibration control pads 16, and is provided with a rectangular base 19 that is part of the substrate stage device 15, four legs 20 that are respectively arranged in a vertical direction at the four corners on the base 19, and a lens barrel holding plate 21 that forms a top plate of the first column 17 and is attached to the top end portions of the four legs 20. At the center of this lens barrel holding plate 21, an aperture 21a is formed that is round in plan view, and the projection optical system PL is inserted into this aperture 21a from above. In this projection optical system PL, a flange FL is arranged at a position slightly below the center of the projection optical system PL in the height direction, and the projection optical system PL is supported by the lens barrel holding plate 21 from below via the flange FL.

The second column 18 is provided with four legs 22 that are arranged so as to surround the projection optical system PL on the lens barrel holding plate 21, and a base 23 that defines a flat plate that is a part of the reticle stage device 13, which is connected to the top end portion of the four legs 22. At the center of the base 23, an opening 23a through which the illumination light IL passes is formed. Alternatively, the entire or part of base 23 (the part equivalent to the opening 23a) can also be formed of a light transmissive material.

Vibrations at a micro G level are prevented from being transmitted from the floor FD to the main body column 14 by the vibration control pads 16.

With respect to the projection optical system PL, the direction of the optical axis AX is a Z-axis direction. Here, a catadioptric system is used that is formed of a plurality of lens elements arranged at a predetermined interval along the optical axis AX direction so as to have a telecentric optical arrangement on both sides. This projection optical system PL has a predetermined projection magnification, for example, unity magnification. Because of this, when the illumination region of the reticle R is illuminated by the illumination light IL from the illumination optical system 12, a unity non-inverted image of a pattern of the illumination region on the reticle R is exposed via the projection optical system PL onto an exposure region conjugate to the illumination region on the glass substrate P coated by a photoresist.

The reticle stage device 13 is provided with the base 23, a reticle stage (stage main body) RST that is floatingly supported in a non-contact manner over the base 23 and a reticle driving system 24 that drives the reticle stage RST by a predetermined stroke in the Y-axis direction, which is a scanning direction (relative movement direction) and that also minutely drives the stage in the X-axis direction perpendicular to the Y-axis direction. The reticle stage device 13 also includes reaction frames (supports) 25 and 26 that receive a reaction force that is generated during the driving of the reticle stage RST by the reticle driving system 24.

Figure 2:
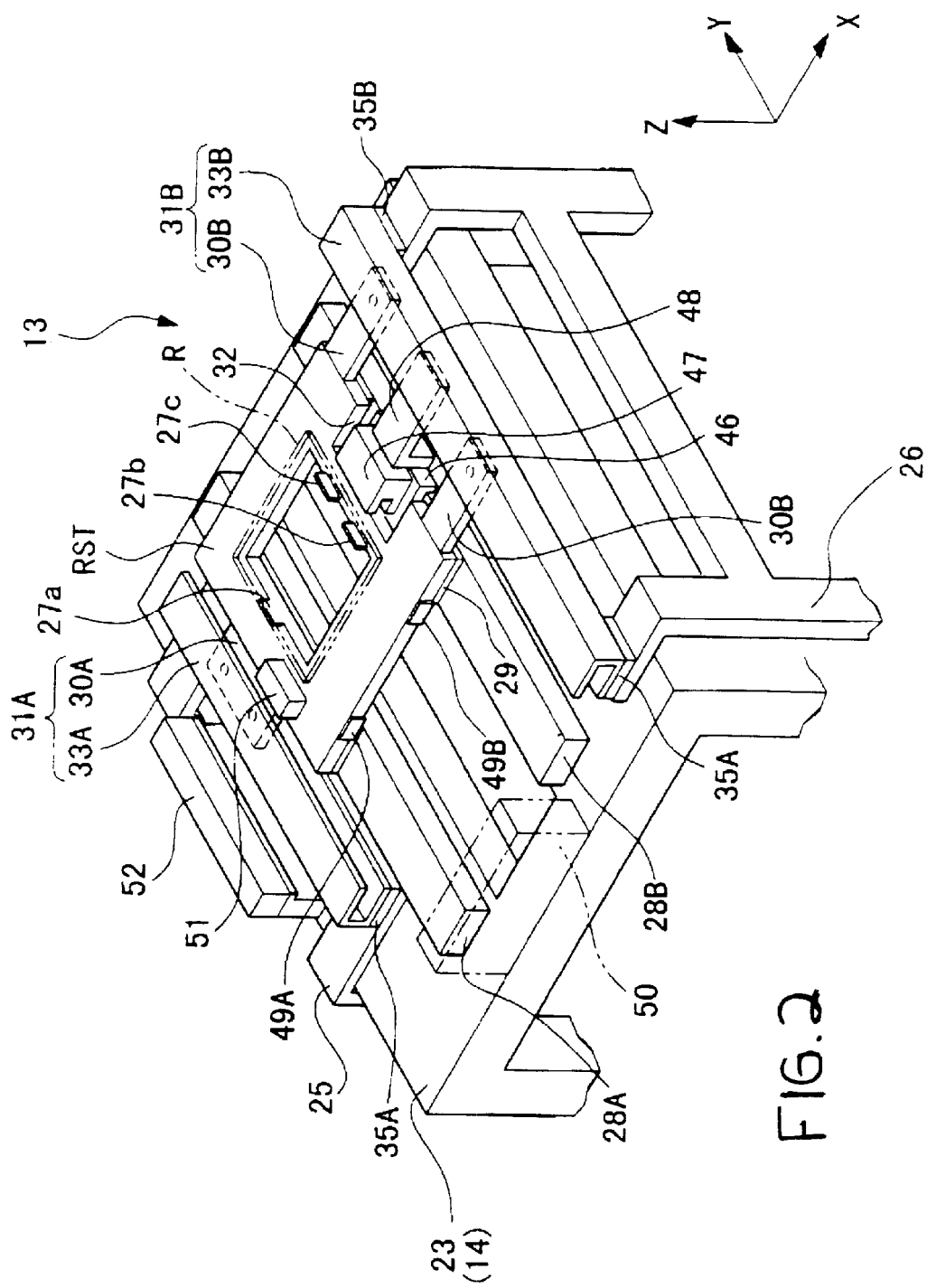
FIG. 2 is a perspective view of a reticle stage device of the FIG. 1 exposure apparatus.

In particular, as shown in the perspective view of FIG. 2, the reticle stage RST has a rectangular shape, that is, it is a rectangular-frame shaped flat member having a rectangular aperture formed at its center. Three vacuum chucks 27a–27c are arranged on the reticle stage RST. The reticle R is absorbed and held on the reticle stage RST by the vacuum chucks 27a–27c.

A pair of Y guides 28A and 28B are disposed over the base 23, and extend in the Y-axis direction, which is a scanning direction, and are spaced from each other by a predetermined interval. The reticle stage RST is disposed over the Y guides 28A and 28B, and the reticle stage RST is floatingly supported in a non-contact manner over the Y guides 28A and 28B by a plurality of air pads (air bearings) 29 arranged in its bottom surface.

In both side surfaces of the reticle stage RST facing in the X-axis direction, a pair of movable parts 30A and 30B protrude toward the X-axis direction. A pair of the movable parts 30B are arranged on the +X side, and have a cut-out 32 formed at the center, in the Y-axis direction, of the +X side end portion of the reticle stage RST. Furthermore, in correspondence with the movable parts 30A and 30B, in both external sides of the Y guides 28A and 28B relative to the X-axis direction, Y motors 31A and 31B, functioning as linear motors, are constituted that include the movable parts 30A and 30B. The stationary parts 33A and 33B of the linear motors, have a U-shaped cross-section in the ZX plane, opened toward the reticle stage RST so as to sandwich the movable parts 30A and 30B, and extend in the Y-axis direction. The movable parts 30A and 30B (and therefore the reticle stage RST) are driven by a Lorentz force generated in the Y-axis direction by electromagnetic interaction with the stationary parts 33A and 33B.

Commercially-available moving coil type linear motors can be used for the Y motors 31A and 31B. Alternatively, moving magnet type linear motors can also be used for the pair of Y motors 31A and 31B. The Y motors 31A and 31B are controlled by a main controller (undepicted).

Figure 3:
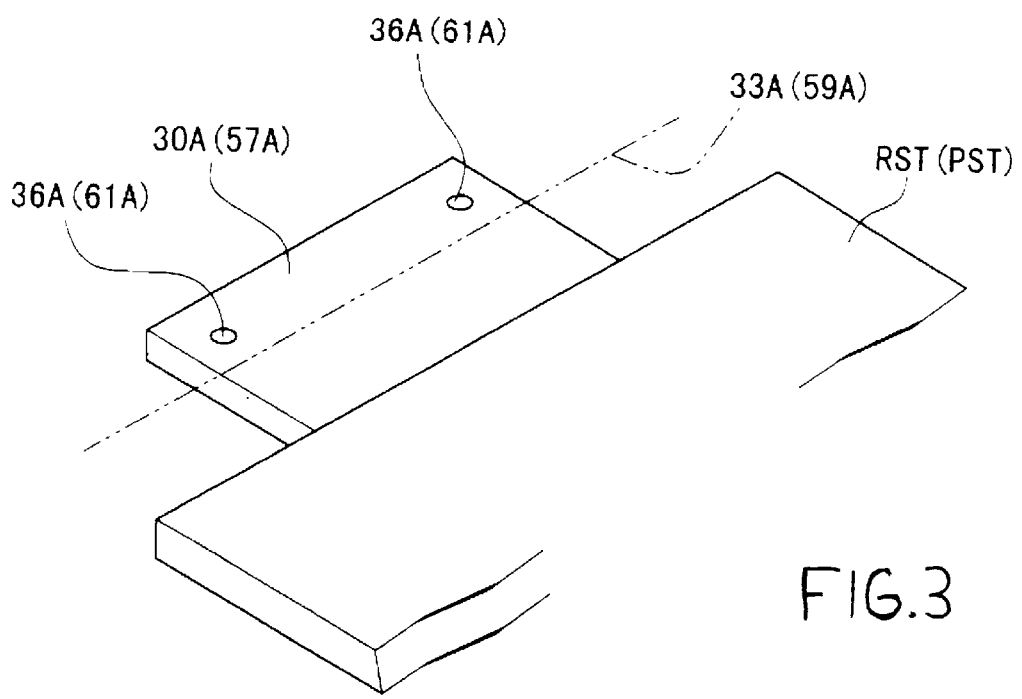
FIG. 3 is an enlarged perspective view of a movable part protruding from the reticle stage (or substrate stage)

As shown in FIG. 3, in the movable part 30A, facing the stationary part 33A, a plurality of (two in this case) gap sensors (detectors) 36A and 36B are located in the vicinity of both ends in the Y-axis direction and arranged along the Y-axis direction. The gap sensor 36A detects a gap size between the movable part 30A and the stationary part 33A in a non-contact manner, for example, it is a reflective type sensor having an operational range of approximately 2 mm.

Figure 4:
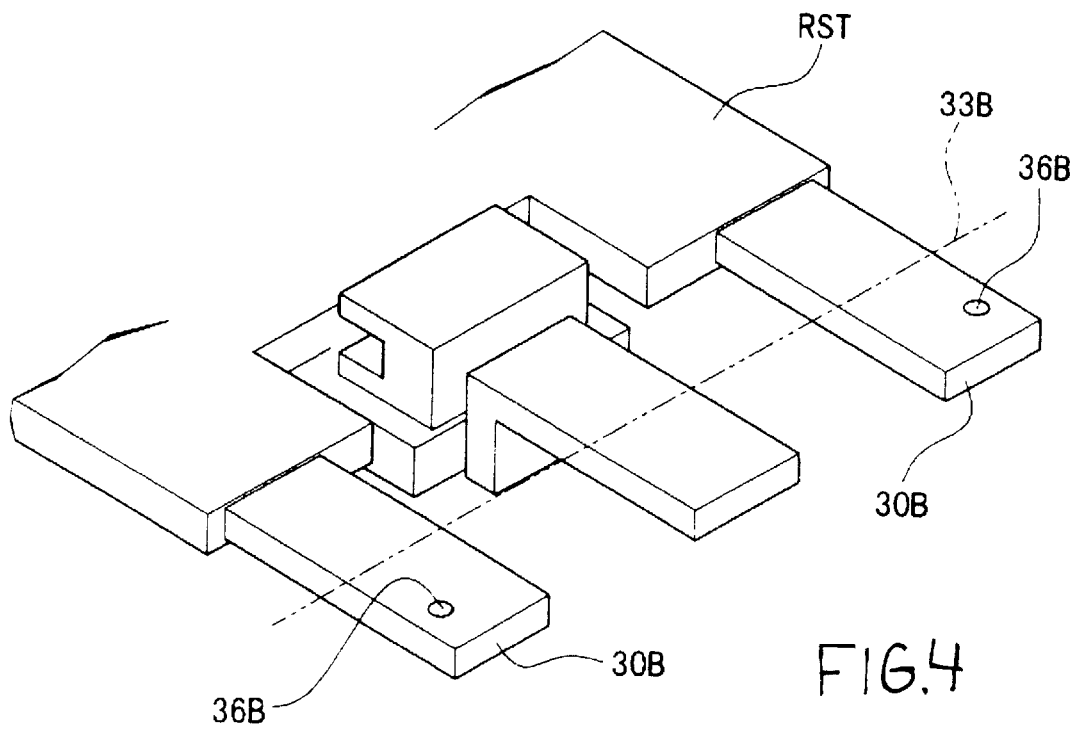
FIG. 4 is an enlarged perspective view of a movable part protruding from the reticle stage.

In the same manner, in the respective movable parts 30B which are separately arranged, as shown in FIG. 4, facing the stationary part 33B, gap sensors (detectors) 36B are arranged along the Y-axis direction in the vicinity of both ends in the Y-axis direction. The gap sensors 36B detect a gap size between the movable parts 30B and the stationary part 33B in a non-contact manner. In the same manner as the gap sensors 36A, for example, optical reflective type sensors can be used. The detection result of the gap sensors 36A and 36B is output to a controller 43 (see FIG. 6).

As shown in FIG. 2, at both ends in the Y-axis direction, the stationary part 33A is supported via a pair of positional adjustment devices (actuators) 35A and 35B (however, 35B is not depicted in FIG. 2) on top of the reaction frame 25. As mentioned previously, the reaction frame 25 is vibrationally isolated from the main body column 14 that supports the base 23. In the same manner, at both ends in the Y-axis direction, the stationary part 33B is supported via a pair of positional adjustment devices (actuators) 35A and 35B on top of the reaction frame 26, which also is vibrationally isolated from the main body column 14. The reaction frames 25 and 26 extend through openings formed in the lens barrel holding plate 21, the base 19, and the base plate BP, respectively, and have base ends that are fixed to the floor FD.

Figure 5:
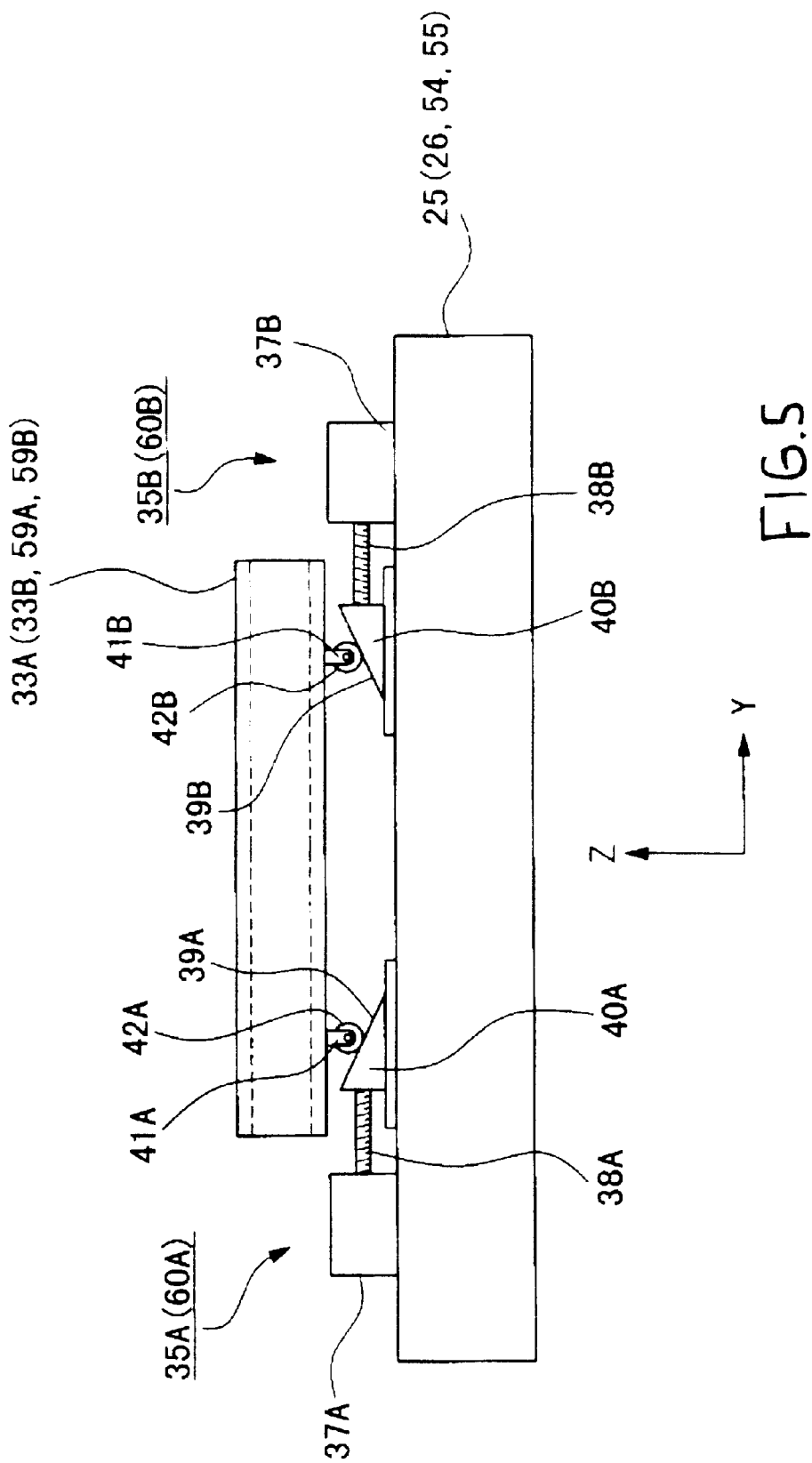
FIG. 5 is a front view of positional adjustment devices (actuators) arranged between stationary parts and a reaction frame.

The positional adjustment devices 35A and 35B respectively adjust a relative position (in the Z-axis direction) of the stationary parts 33A (and/or 33B) with respect to the movable parts 30A (and/or 30B). As shown in FIG. 5, the positional adjustment devices 35A and 35B include rotary motors 37A and 37B, lead screws 38A and 38B, conversion members 40A and 40B, and rollers 42A and 42B. The rotary motors (rotational driving devices) 37A and 37B are arranged on the reaction frame 25 (or 26). The lead screws 38A and 38B are rotated by the rotary motors 37A and 37B, respectively. The conversion members (moving parts) 40A and 40B include ball nuts, for example, that engage with the lead screws 38A and 38B, respectively. The conversion members 40A and 40B also have sloped surfaces 39A and 39B, respectively, that are sloped with respect to the Y-axis direction, and can freely move in the Y-axis direction on the reaction frame 25 (or 26), as the lead screws 38A and 38B are rotated by the motors 37A and 37B. The rollers (rolling movement devices) 42A and 42B roll on the sloped surfaces of 39A and 39B of the conversion members 40A and 40B in the Y-axis direction and are rotatably attached to the stationary part 33A (or 33B) via stays 41A and 41B, respectively so as to be rotatable about the X-axis. The conversion members 40A and 40B and the rollers 42A and 42B are formed of materials having a large friction coefficient so that they do not slip relative to each other.

Figure 6:
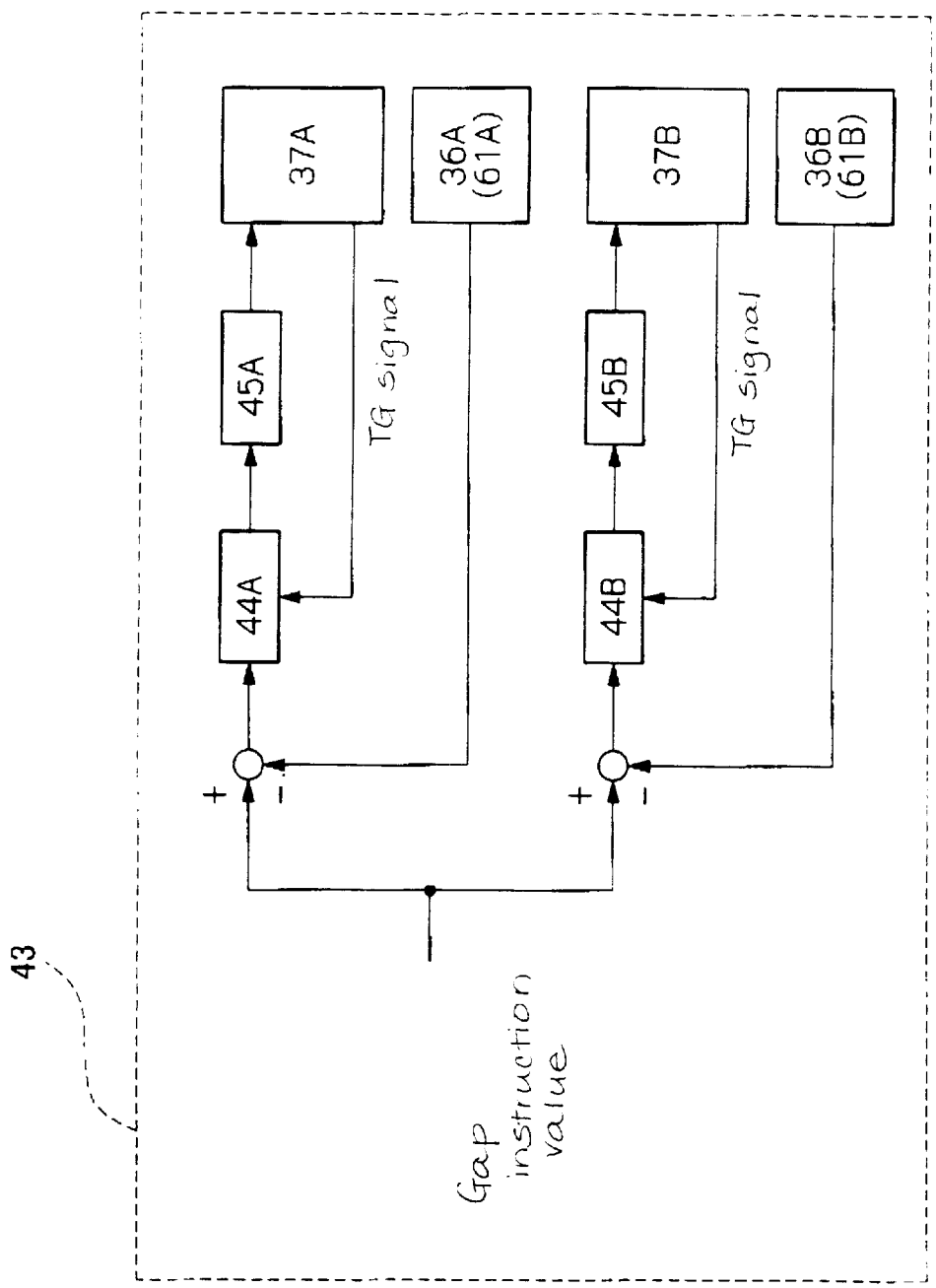
FIG. 6 is a block diagram of a controller that controls motors of the positional adjustment devices.

As shown in FIG. 6, rotational driving of the motors 37A and 37B is controlled by the controller 43, which performs Z-direction controlling of the stationary parts 33A and 33B. In particular, a detection signal (gap size) of the gap sensors 36A and 36B (or 61A, 61B, 73A, and 73B, which will be discussed later) is constantly input to the controller 43. The difference between a gap instruction value (a predetermined gap size set in advance) and the detected gap size detected by the sensors 36A and 36B (or 61A and 61B) is supplied to gap control servo calculators 44A and 44B within the controller 43. The outputs of calculators 44A and 44B are amplified by amplifiers 45A and 45B, and the resulting signal is used to control the motors 37A and 37B. Furthermore, each of the respective motors 37A and 37B includes a tachometer (undepicted) that outputs the number of rotations (rotational amount) to the gap control servo calculators 44A and 44B as an electrical signal (TG signal).

In FIG. 2, inside the space of cut-out 32 of the reticle stage RST, an air slider 46 having a degree-of-freedom in the scanning direction only is arranged and positioned on the Y guide 28B. Furthermore, an X motor stationary part 47 of an X motor is disposed on this air slider 46. For example, a voice coil motor can be used for the X motor. By driving an undepicted movable part disposed on the reticle stage RST side in the X-axis direction, which is a non-scanning direction, by a Lorentz force generated by electromagnetic interaction, the reticle stage RST can be slightly driven in the X-axis direction.

In the air slider 46, a movable part 48 is arranged and defines an air slider driving linear motor that drives the air slider 46 along with the stationary part 33B. Regardless of the position of the reticle stage RST, the X motor needs to be able to drive the reticle stage RST in the X-axis direction. Therefore, the X motor is caused to constantly follow the reticle stage RST (as the reticle stage is driven) by detecting the distance between the reticle stage RST and the X motor (i.e., the air slider 46 and the stationary part 47) by an undepicted gap sensor and then driving the air slider driving linear motor to maintain a predetermined relationship between the reticle stage RST and the X motor.

Meanwhile, a pair of corner cube mirrors 49A and 49B are fixed to the side surface of the reticle stage RST facing in the −Y-direction. Opposite to the corner cube mirrors 49A and 49B, a Y interferometer 50 is fixed to the end portion of the base 23 in the −Y-direction. This Y interferometer 50 projects an interferometer beam with respect to the corner cube mirror 49A and 49B and is constituted by a pair of double axis interferometers that measure the position of the corner cube mirrors 49A and 49B in the Y-axis direction with a predetermined resolution, e.g., approximately 0.5–1 nm of resolution, by receiving the respective reflected light beams.

Furthermore, an optical unit 51 including an undepicted polarizing beam splitter, a ¼ wavelength plate, or the like is fixed to the end portion of the top surface of the reticle stage RST on the −X side. Opposite to this optical unit 51, a holding mirror 52 is arranged and extends in the Y-axis direction to the end portions of the top surface of the base 23. The position of the reticle stage RST (reticle R) in the X-axis direction is measured by an X interferometer system that includes the optical unit 51, an undepicted light source unit, a receiver, and the like, with a predetermined resolution, e.g., 0.5–1 nm of resolution via the holding mirror 52.

Figure 7:
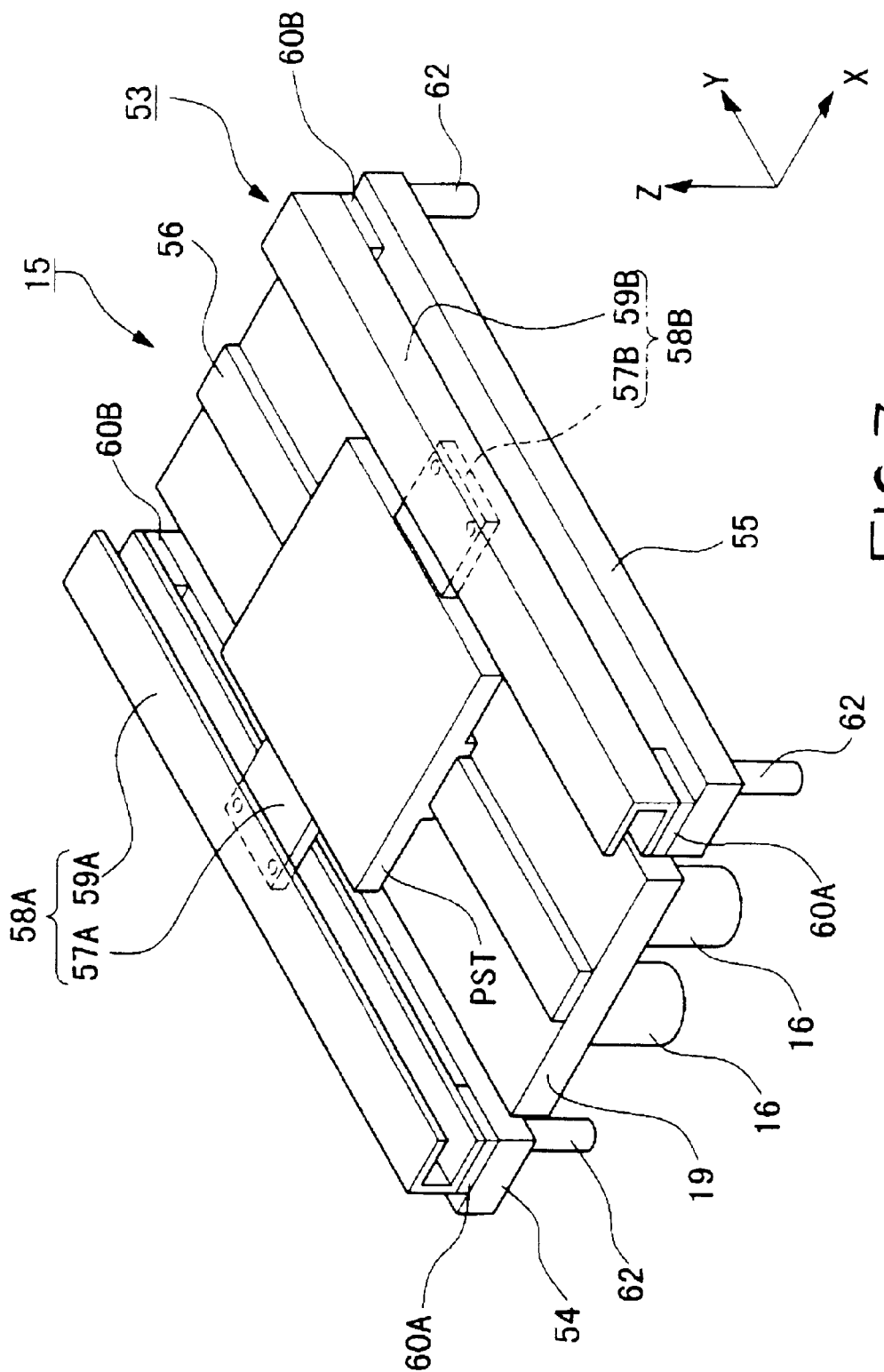
FIG. 7 is a perspective view of a substrate stage device of the FIG. 1 exposure apparatus.

As shown in FIGS. 1 and 7, the substrate stage device 15 is provided with the base 19, a substrate stage (stage main body) PST that is floatingly supported in a non-contact manner over the base 19, a substrate driving system 53 that drives the substrate stage PST with a predetermined stroke in a two-dimensional manner in the Y-axis direction and in the X-axis direction, and reaction frames (supports) 54 and 55 that receive a reaction force that is generated during the driving of the substrate stage PST by the substrate driving system 53. The reaction frames are arranged on both sides of the base 19 in the X-axis direction. The reaction frames 54 and 55 are supported by support members 62 whose ends are fixed to the floor FD, so that they are vibrationally isolated from the base 19.

The substrate stage PST is movably arranged along Y guide 56, which extends in the Y-axis direction over the base 19, which is part of the first column 17. On the substrate stage PST, a glass substrate P is held by vacuum absorption or the like via an undepicted substrate holder. Under the substrate stage PST, a plurality of air pads, which are undepicted, are arranged so that the substrate stage PST is floatingly supported by these air pads via a predetermined clearance with respect to a moving surface 19a of the base 19. Movable parts 57A and 57B of Y-axis linear motors 58A and 58B are driven in the Y-axis direction by a Lorentz force that is generated by electromagnetic interaction with stationary parts 59A and 59B of the linear motors 58A and 58B. This causes the substrate stage PST to be driven in the Y-axis direction.

The movable parts 57A and 57B protrude in the X-axis direction from opposite sides of the substrate stage PST. The stationary parts 59A and 59B have a U-shaped cross-section, opened toward the substrate stage PST, and extend in the Y-axis direction. The stationary parts 59A and 59B are mounted to the reaction frames 54 and 55 via positional adjustment devices 60A and 60B having the same structure as the positional adjustment devices 35A and 35B. In FIG. 7, depiction of the X motor is omitted.

Here, commercially available moving coil type linear motors can be used for the Y motors 58A and 58B. Alternatively, moving magnet type linear motors can also be used for the Y motors 58A and 58B. The Y motors 58A and 58B are controlled by a main controller (undepicted).

Figure 8:
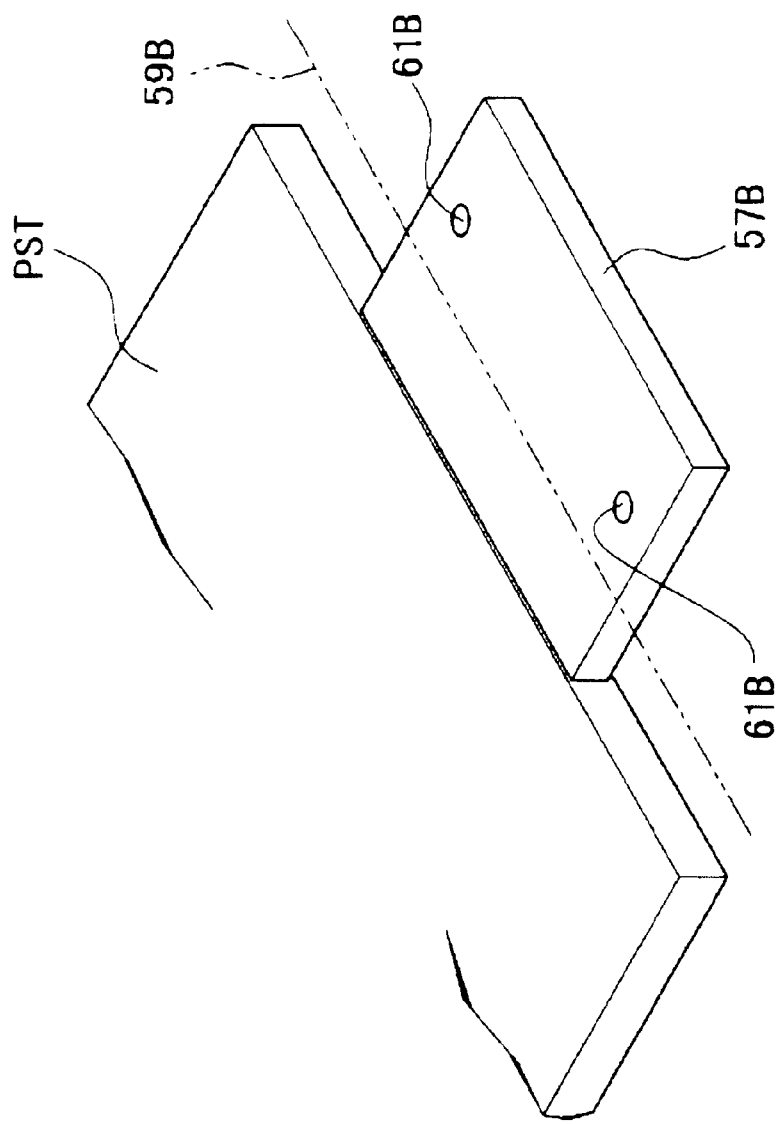
FIG. 8 is an enlarged perspective view of a movable part protruding from the substrate stage.

Additionally, as shown in FIG. 3, in the movable part 57A, opposite to the stationary part 59A, a plurality of (two gap sensors in this case) gap sensors (detectors) 61A are arranged in the Y-axis direction and positioned in the vicinity of both ends in the Y-axis direction. In the same manner, as shown in FIG. 8, in the movable part 57B, opposite to the stationary part 59B, a plurality of (two gap sensors in this case) gap sensors (detectors) 61B are arranged in the Y-axis direction and positioned in the vicinity of both ends in the Y-axis direction.

The gap sensors 61A detect a gap size between the movable part 57A and the stationary part 59A in a non-contact manner. The gap sensors 61B detect a gap size between the movable part 57B and the stationary part 59B in a non-contact manner. Both gap sensors can be a reflective type sensor in the same manner as the gap sensors 36A and 36B. The detection result of these gap sensors 61A and 61B is output to the controller 43 (see FIG. 6).

The position of the substrate stage PST in the XY plane is constantly measured by a laser interferometer system 63 shown in FIG. 1 with a predetermined resolution, e.g., approximately 0.5–1 nm resolution. This measurement value is supplied to the main controller, and in the main controller, based on the measurement value of the laser interferometer system 63, by controlling the linear motors, positional control of the substrate stage PST (and the held glass substrate P) is performed.

Among the stage device and the exposure apparatus, first, the operation of the positional adjustment devices 35A and 35B and 60A and 60B arranged in the reticle stage device 13 and in the substrate stage device 15 is explained.

Based on instructions from the power amplifiers 45A and 45B, when the motors 37A and 37B are actuated, the lead screws 38A and 38B are rotated about their axis. When the lead screws 38A and 38B are rotated, based on the rotational direction and the number of rotations, the conversion members 40A and 40B are moved by a predetermined amount in a predetermined direction in the Y-axis direction. By this operation, the rollers 42A and 42B positioned on the sloped surfaces 39A and 39B of the conversion members 40A and 40B move in the Z direction by rolling on the sloped surfaces 39A and 39B, that is they move in a direction perpendicular to the substrate mounting surface of the substrate stage PST and the reticle mounting surface of the reticle stage RST.

In other words, movement of the conversion members 40A and 40B in the Y-axis direction in response to the number of rotations of the motors 37A and 37B is converted to movement to the Z-axis direction due to the conversion members 40A and 40B. Therefore, the stationary part 33A (or 33B, 59A, 59B) is moved in the optical axis direction (the Z-axis direction) of the projection optical system PL. Furthermore, by differentiating a moving amount between the rollers 42A and 42B in the Z direction, a posture (inclination) can be adjusted with respect to the stationary part 33A (or 33B, 59A, 59B) in the Y-axis (i.e., tilting about the X-axis can be adjusted).

Here, if the number of rotations of the motors 37A and 37B is defined as R, the lead length of the lead screws 38A and 38B is defined as L, and a slope angle with respect to the sloped surfaces 39A and 39B in the Y-axis direction is defined as θ, the following shows the moving amount ZL of the stationary part 33A (or 33B, 59A, 59B) in the Z-axis direction.

$$ZL = R \times L \times \tan \theta \tag{1}$$

Furthermore, if the difference of the moving amount of the rollers 42A and 42B in the Z-axis direction is defined as ΔZ and the interval (spacing) between the rollers 42A and 42B is defined as D, the following shows inclination θF with respect to the stationary part 33A (or 33B, 59A, 59B) in the Y-axis.

$$\theta F = \tan^{-1} (\Delta Z/D) \tag{2}$$

Therefore, if the difference of the number of rotations of the motors 37A and 37B is defined as ΔR, the following shows inclination θF according to equations (1) and (2).

$$\theta F = \tan^{-1} ((\Delta R \times L \times \tan \theta)/D) \tag{3}$$

Thus, by differentiating the number of rotations of the motors 37A and 37B, inclination of the stationary part 33A (or 33B, 59A, 59B) in the Y-axis direction, that is, a relative positional relationship with respect to the movable part 30A (or 30B, 57A, 57B) in the Y-axis direction can be adjusted.

The following explains an exposure operation by the exposure apparatus 11.

When exposure processing begins, the reticle stage RST that holds the reticle R and the substrate stage PST that holds the glass substrate P are simultaneously synchronously moved at the same speed by an undepicted scanning controller in the Y-axis direction with respect to the illumination light IL. Accordingly, the pattern of the reticle R illuminated by the illumination light IL is consecutively exposed onto the glass substrate P.

At this time, due to actuation of the Y motors 31A and 31B on the reticle stage RST side, the movable parts 30A and 30B and the stationary parts 33A and 33B relatively move with respect to each other in the Y-direction while a predetermined gap size (e.g., 1 mm) is maintained between them with respect to the Z direction. In the Y motors 58A and 58B, the movable parts 57A and 57B and the stationary parts 59A and 59B also relatively move with respect to each other in the Y-direction while a predetermined gap size (e.g., 1 mm) is maintained between them with respect to the Z direction.

Due to this synchronous movement, the vibration control pads 16 have different loads applied to them, and therefore their positions in the Z-direction differ from each other. Therefore, as the bases 23 and 19 are inclined, the reticle stage RST and the substrate stage PST are also inclined. Furthermore, in the reticle stage RST side, the movable parts 30A and 30B are relatively inclined with respect to the stationary parts 33A and 33B, and the gap size between the movable parts 30A and 30B and the stationary parts 33A and 33B changes.

The changed gap size is output to the gap control servo calculators 44A and 44B of the controller 43 by the gap sensors 33A and 33B, which constantly detect the changed gap size. The gap control servo calculators 44A and 44B calculate the difference between the detection result of the gap sensors 36A and 36B and a gap instruction value (1 mm in this example) and control driving of the motors 37A and 37B, respectively, via the power amplifiers 45A and 45B so as to make this difference zero.

The relative angle about the X axis (i.e., tilt about the X-axis) of the movable parts 30A and 30B with respect to the stationary parts 33A and 33B is determined from the gap size detected by the gap sensors 36A and 36B. The tilt about the X-axis is reduced to zero by driving the motors 37A and 37B by different amounts so as to make the relative angle zero. If the relative angle difference is defined as θF, the difference ΔR of the number of rotations of the motors 37A and 37B can be shown by using the following equation (4).

$$\Delta R = (D \times \tan \theta F)/(L \times \tan \theta) \tag{4}$$

As described above, due to this rotational driving control, the stationary parts 33A and 33B are made to be parallel to the inclined movable parts 30A and 30B, and the gap size between the movable parts 30A and 30B and the stationary parts 33A and 33B can be maintained constant.

Furthermore, with respect to positional adjustment for the stationary parts 33A and 33B, the gap control servo calculators 44A and 44B feedback-control rotational driving of the rotational motors 37A and 37B by only using the detection signal of the gap sensors 36A and 36B. However, there is a difficulty in responsiveness because the gap sensors 36A and 36B are located distant from the positional adjustment devices 35A and 35B. By using the difference between the detection signals of the gap sensors 36A and 36B and the gap instruction value, if P•I•D (Proportional Integral Derivative) control is performed, response can be improved. However, if P•I•D control is performed in a state in which a non-linear component exists, caused for example by a clearance (backlash) or the like between the lead screws 38A and 38B and the ball screw, there is a possibility that control might be unstable.

Therefore, in this embodiment, the number of rotations of the rotational motors 37A and 37B is input to the gap control servo calculators 44A and 44B as a TG signal from a tachometer, so that positional adjustment for rotational driving control, that is, control of the stationary parts 33A and 33B, with excellent stability and good responsiveness is achieved.

Furthermore, in the same manner as in the reticle stage RST side, in the substrate PST side as well, as the movable parts 57A and 57B are relatively inclined with respect to the stationary parts 59A and 59B, the gap size in the Z direction between the movable parts 57A and 57B and the stationary parts 59A and 59B changes. However, as the respective gap sensors 61A and 61B detect this gap size, the gap control servo calculators 44A and 44B respectively control driving of the motors 37A and 37B in the substrate stage PST side via the power amplifiers 45A and 45B. Due to this rotational driving control, the stationary parts 59A and 59B are made to be parallel to the inclined movable parts 57A and 57B, and the gap size between the movable parts 57A and 57B and the stationary parts 59A and 59B can be maintained constant.

Furthermore, as the stationary parts are inclined along with the movable parts, both the reticle stage RST and the substrate stage PST are inclined with respect to the floor FD, and the amount by which the vibration control pads 16 move downward are not identical, the lens barrel holding plate 21 is inclined at the same angle as the bases 23 and 19 are inclined. Because of this, the mounting surface of the reticle stage RST on which the reticle R is mounted and the mounting surface of the substrate stage PST on which the glass substrate P is mounted remain perpendicular to the optical axis AX of the projection optical system PL, so there will be no problem with exposure processing (the illumination light IL is not parallel to the optical axis AX of the projection optical system PL, but there is only a small deviation from parallel, so there will be no problem with exposure processing).

Additionally, when the detection result of the gap sensors 36A, 36B, 61A, and 61B exceeds the adjustable range of the positional adjustment devices 35A and 35B (or 60A and 60B), a warning can be immediately generated to an operator by an alarm or the like.

In the stage device and the exposure apparatus of this embodiment, the gap size between the movable parts 30A and 30B (57A and 57B) and the stationary parts 33A and 33B (59A and 59B) is detected by the gap sensors 36A and 36B (61A and 61B), and the position of the stationary parts 33A and 33B (59A and 59B) is adjusted. Therefore, by using inexpensive passive type vibration control pads 16, even if the reticle stage RST (or substrate stage PST) is inclined, the movable parts 30A and 30B (57A and 57B) can be prevented from being contacted with the stationary parts 33A and 33B (59A and 59B), an expensive active type control device does not need to be used, the cost of the device can be decreased, and the number of arrangement-adjusting operations made can be decreased. Furthermore, by avoiding the use of an active type actuator, an effect of generating heat can be eliminated.

Furthermore, in the stage device and the exposure apparatus of this embodiment, the gap size between the movable parts 30A and 30B (57A and 57B) and the stationary parts 33A and 33B (59A and 59B) can be maintained constant, so even when considering thrust rippling, position•speed control of the stages RST and PST can be performed as expected and deterioration of stage control performance can be prevented.

If the gap sensors 36A, 36B, 61A, and 61B are arranged on the stationary parts 33A and 33B (59A and 59B), gap sensors will need to be arranged along the entire movable range of the movable parts 30A and 30B (57A and 57B). However, in this embodiment, the gap sensors 36A, 36B, 61A, and 61B are arranged in the movable parts 30A and 30B (57A and 57B), so the number of gap sensors to be arranged can be minimized, the number of adjusting operations of the gap sensors can be decreased, and the cost of the device can be further reduced.

In particular, in this embodiment, the position of the stationary part is adjusted by a simplified mechanism such as a rotary motor, a lead screw, a conversion member, a roller, or the like, so adjustment of the gap size can be performed at low cost. Furthermore, with respect to the number of rotational controls of the motors 37A and 37B, feedback of the number of rotations is performed by using a tachometer, so rotational driving control, that is, positional adjustment with excellent stability and good responsiveness for the stationary part can be accomplished.

Additionally, in this embodiment, the positional adjustment devices 35A and 35B (60A and 60B) adjust the position of approximately several ten kilos of stationary parts 33A and 33B (59A and 59B), so minute adjustment is easier than the case when the position of several hundred kilos of reticle stage RST (or substrate stage PST) in which the movable parts 30A and 30B (or 57A and 57B) are provided is adjusted. Therefore, the relative positional adjustment with high accuracy can be performed between the movable parts and the stationary parts.

In addition, in the stage device and the exposure apparatus of this embodiment, because the stationary parts 33A and 33B (or 59A and 59B) are moved in the Z direction (that is, the direction perpendicular to the mounting surface of the glass substrate P and the mounting surface of the reticle R), this mechanism also can be used for focus positional adjustment of the glass substrate P in addition to adjustment of the gap size between the movable parts and the stationary parts. This manner of focus control is not limited to a passive type vibration control table 16, but may also be applied to an active type vibration control table.

Furthermore, in the exposure apparatus of this embodiment, the projection optical system PL, the reticle stage RST, and the substrate stage PST are integrally supported by the main body column 14, and the lens barrel holding plate 21 and the bases 23 and 19 are inclined at the same angle. Therefore, the mounting surface of the reticle stage RST and the mounting surface of the substrate stage PST are maintained perpendicular to the optical axis of the projection optical system PL, so problems of exposure processing can be prevented.

Figure 9:
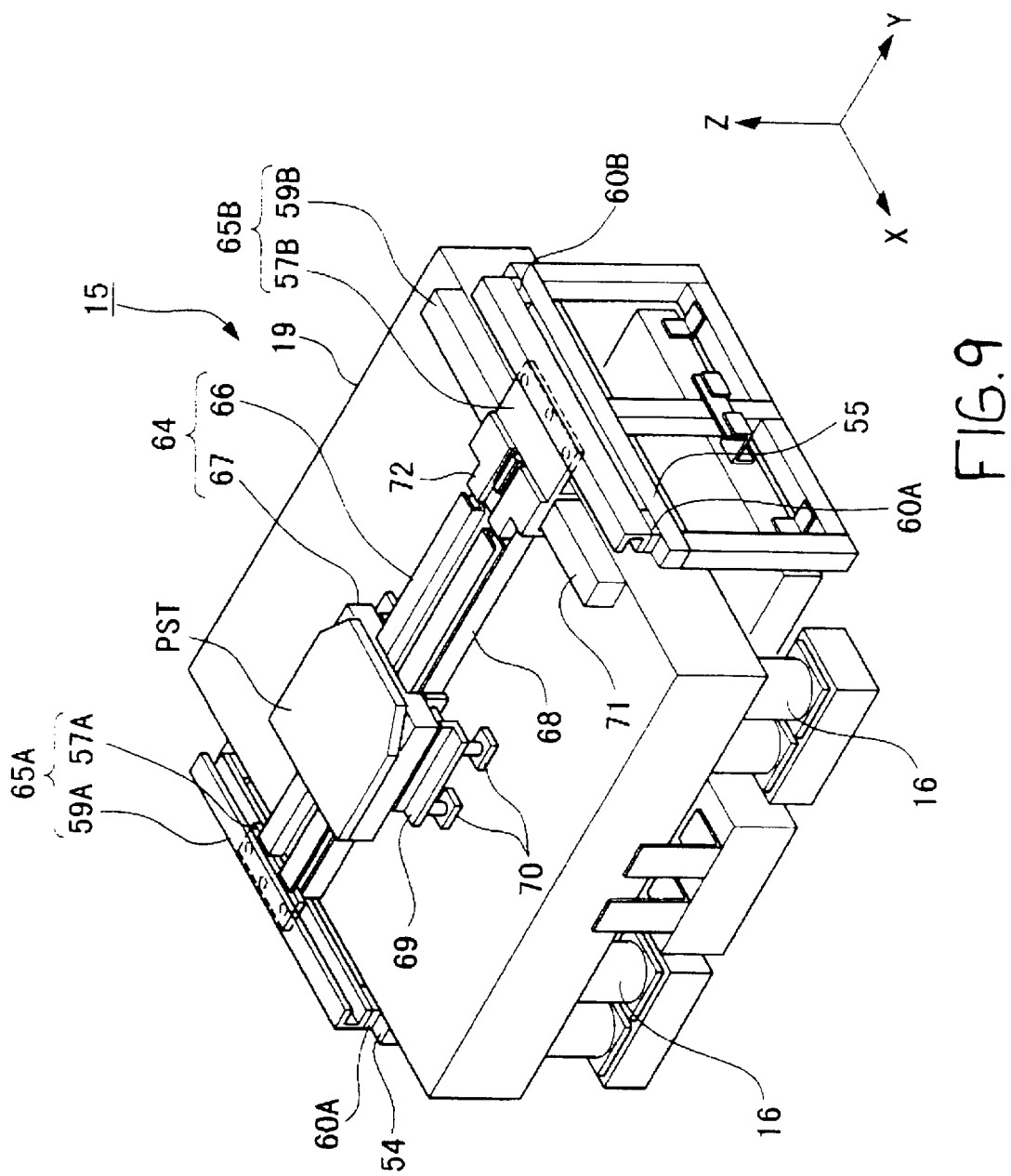
FIG. 9 is a perspective view of a substrate stage device of a second embodiment of the invention, in which the substrate stage two-dimensionally moves.
Figure 10:
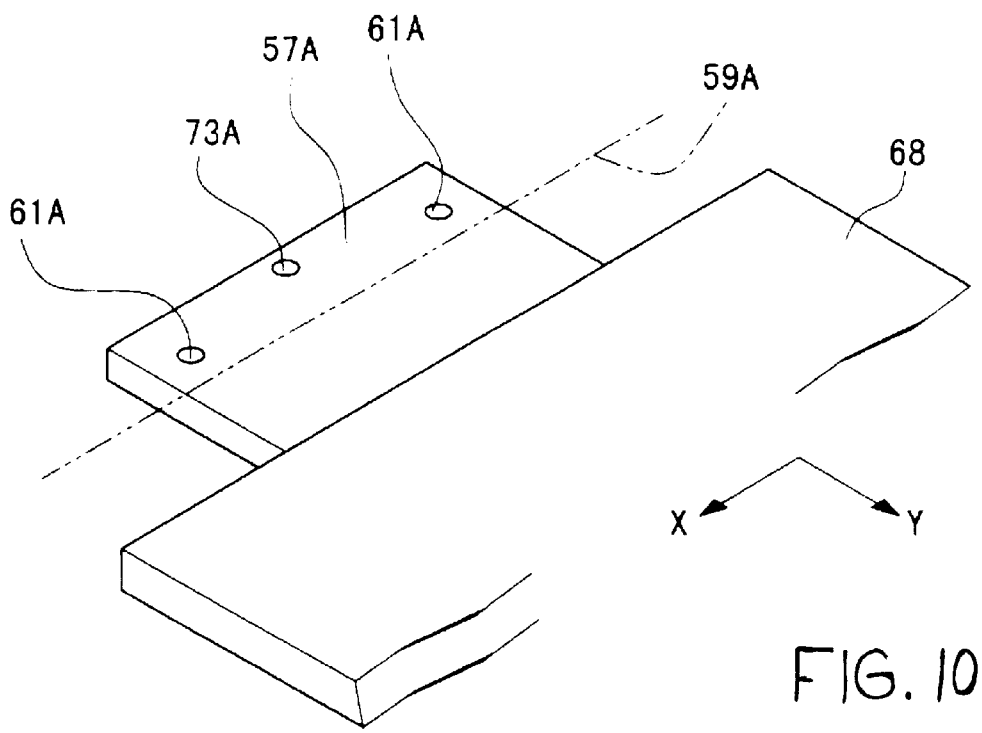
FIG. 10 is an enlarged view of a movable part in which gap sensors are arranged in the FIG. 9 substrate stage device.
Figure 11:
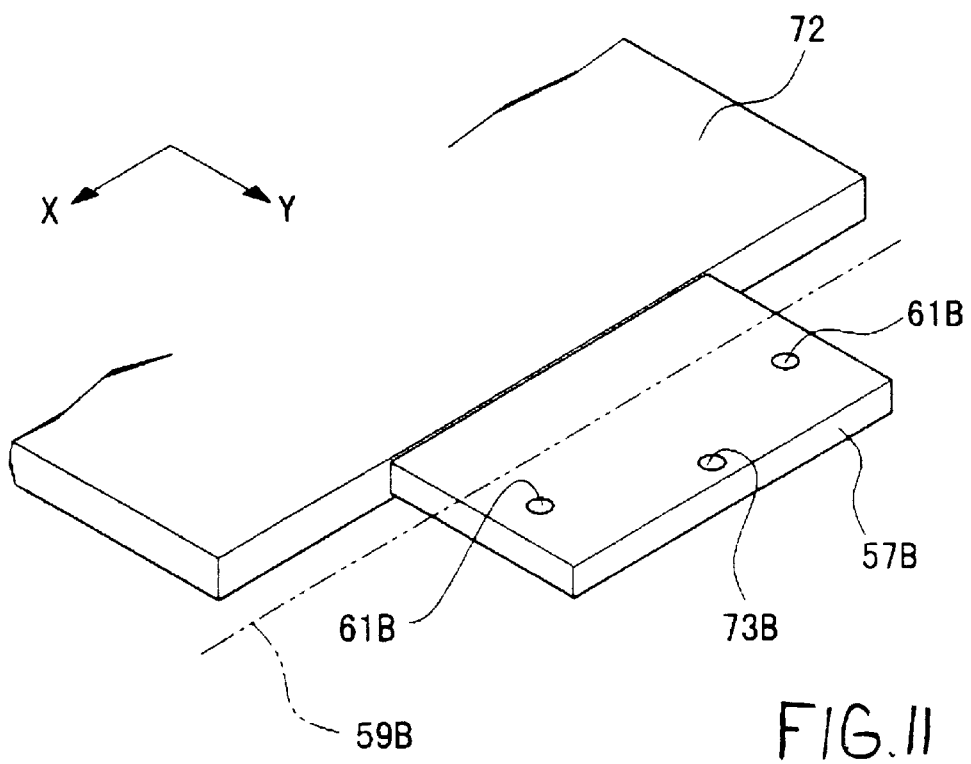
FIG. 11 is an enlarged view of a movable part in which gap sensors are arranged in the FIG. 9 substrate stage device.

FIGS. 9–11 are diagrams showing a second embodiment of the stage device and exposure apparatus of this invention. In these diagrams, the same structural elements as in the first embodiment shown in FIGS. 1-8 are identified by the same symbols, and their explanation is omitted. The difference between the first and second embodiments is that the exposure apparatus 11 exposes a pattern of the reticle R onto a glass substrate P in a step-and-scan method.

FIG. 9 is a perspective view of the substrate stage device 15 of a step and scan type exposure apparatus 11. This substrate stage device 15 is constituted by a base 19, a substrate stage PST, a Y motor 64 that is a linear motor that drives the substrate stage PST in the Y-axis direction, which is a scanning direction, X motors 65A and 65B that are linear motors that drive the substrate stage PST in the X-axis direction, which is a step moving direction, and reaction frames 54 and 55 that receive reaction forces generated due to the driving of the substrate stage PST by the X motors 65A and 65B.

The Y motor 64 is constituted by a stationary part 66 that extends in the Y-axis direction, and a Y carriage 67 that is a movable part to which the substrate stage PST is fixed and that moves relative to the stationary part 66. The stationary part 66 is arranged on a Y guide 68 that extends in the Y-axis direction. Furthermore, in the Y carriage 67, a moving member 69 which sandwiches (i.e., it is located on opposite sides of) the Y guide 68 is integrated to the Y carriage 67 and is movably arranged with respect to the Y guide 68. The moving member 69 is floatingly supported with respect to the base 19 by air pads 70 (air bearings) that are arranged at its bottom surface side.

The X motor 65A is constituted by a movable part 57A disposed in the −Y end portion of the Y guide 68 and a stationary part 59A that is supported on the reaction frame 54 via the positional adjustment devices 60A and 60B. The X motor 65B is constituted by a movable part 57B disposed in an X carriage 72 that is located at the +Y side end of the Y guide 68. X carriage 72 is movable along an X guide 71 that extends in the X-axis direction. The X motor 65B also includes a stationary part 59B that is supported on the reaction frame 55 via the positional adjustment devices 60A and 60B. The respective stationary parts 59A and 59B have a U-shaped cross-section that opens toward the substrate stage PST so as to sandwich the movable parts 57A and 57B.

As shown in FIG. 10, in the movable part 57A, at positions opposite to the stationary part 59A, gap sensors 61A spaced from each other in the X-axis direction and a gap sensor (positional detection device) 73A spaced from the gap sensors 61A in the Y-axis direction and located substantially midway between the gap sensors 61A and 61A are respectively arranged. In the same manner, as shown in FIG. 11, in the movable part 57B, at positions opposite to the stationary part 59B, gap sensors 61B spaced from each other in the X-axis direction and a gap sensor (positional detection device) 73B spaced from the gap sensors 61B in the Y-axis direction and located substantially midway between the gap sensors 61B and 61B are respectively arranged.

These gap sensors 61A and 61B detect inclination of the movable parts 57A and 57B in the X-axis direction (i.e., tilting about the Y-axis), and the gap sensors 73A and 73B detect inclination of the movable parts 57A and 57B in the Y-axis direction (i.e., tilting about the X-axis). Reflective type sensors preferably are used for the gap sensor 73A and 73B, and the detection result is output to the controller 43.

The gap sensors 73A and 73B do not need to be arranged midway between the gap sensors 61A/61B, and they also do not need to be spaced in the Y-axis direction from the gap sensors 61A and 61B. Additionally, the gap sensors 61A and 61B do not necessarily have to be arranged along the X-axis direction. In short, the position of the movable part 57 can be defined from data output by three gap sensors 61A and 73A, which may or may not be arranged in a straight line.

In the substrate stage device 15 having the above structure, when a pattern of the reticle R is exposed onto a glass substrate P (undepicted in FIG. 9) on the substrate stage PST, the substrate stage PST scanningly moves in the Y-axis direction and performs stepping movement in the X-axis direction. Therefore, in response to the position of the substrate stage PST, a two-dimensional offset load (i.e., an unequal load) in the X-axis direction and in the Y-axis direction affects the vibration control pads 16 and the base 19.

Because of this, the gap size between the movable parts 57A and 57B and the stationary parts 59A and 59B two-dimensionally changes. Based on the respective gap sizes detected by the gap sensors 61A, 73A and 61B, 73B, the controller 43 drivingly controls the positional adjusting devices 60A and 60B in the stationary part 59A side and the positional adjusting devices 60A and 60B in the stationary part 59B side. By two-dimensionally adjusting the position of the stationary parts 59A and 59B, the gap size between the respective movable parts and stationary parts can be maintained constant.

In the stage device and the exposure apparatus of this embodiment, the respective gap sensors 61A, 61B, 73A, and 73B are arranged in correspondence with the X-axis direction and the Y-axis direction in which the substrate stage PST moves. Therefore, during step-and-scan type exposure processing, even if the base 19 is two-dimensionally inclined, by adjusting a posture of the stationary parts for the respective directions, the gap size between the movable parts and the stationary parts can be maintained at a predetermined value.

Furthermore, in the above-mentioned embodiment, the stationary part has a structure having a U-shaped cross-section that is opened toward a stage. However, for example, as shown in FIG. 12, the stationary parts 59A and 59B can have a structure that is opened toward the +Z direction. In this case, although not depicted, the movable part extends downward toward and into the stationary part in the −Z direction. Furthermore, the Y motors 31A, 31B, 58A, 58B, and 64 and the X motors 65A and 65B that are used above can be either moving coil type or moving magnet type motors.

Additionally, in the above-mentioned embodiment, the relative position of the stationary part with respect to the movable part can be adjusted by the positional adjusting devices 35A, 35B, 60A, and 60B using a rotary motor, a lead screw, a conversion member, a roller, and the like. The invention, however, is not limited to this structure. For example, a piezoelectric device can be arranged between a stationary part and a reaction frame, and a posture of a stationary part can be controlled by driving of this piezoelectric device.

Furthermore, in the above-mentioned embodiment, the gap sensors are arranged in the movable parts; however, they also can be arranged on the stationary part. In this case, a plurality of gap sensors are arranged in a movable range of the movable parts. Furthermore, when the relative position between the movable part and the stationary part is adjusted, a posture of the stationary part is controlled. The invention, however, is not limited to this structure. The position of the movable part, that is, the position of the reticle stage RST and the substrate stage PST can be adjusted.

Additionally, in the above-mentioned embodiment, in both the substrate stage device 15 and the reticle stage device 13 in the exposure apparatus 11, a relative positional relationship between the movable part and the stationary part can be adjusted. However, if the gap size therebetween can be large, it is also possible to adjust the positional relationship in only one of the stages.

Furthermore, in the above-mentioned embodiment, the stage device of this invention is applied to the exposure apparatus 11. However, the invention also can be applied to precision measurement devices such as a positional coordinate measurement device of a mask pattern, a drawing device of a transfer mask, and the like in addition to the exposure apparatus 11.

For example, not only a glass substrate P for liquid crystal display devices, but also a semiconductor wafer for semiconductor devices, a ceramic wafer for thin-film magnetic heads, the original version of a mask or a reticle (composed of quartz or a silicon wafer) for use in an exposure apparatus, or the like can be used as a substrate.

The exposure apparatus 11 can also be applied to a step and repeat type projection exposure apparatus (stepper) in which a pattern of a reticle R is exposed in a state in which the reticle R and the substrate P are stationary and the substrate P is sequentially steppingly moved in addition to a step-and-scanning type scanning exposure apparatus (scanning stepper; U.S. Pat. No. 5,473,410) in which the reticle R and the substrate P are synchronously moved while a pattern of the reticle R is scanningly exposed onto the substrate.

As for the type of the exposure apparatus 11, the invention is not limited to an exposure apparatus for fabricating liquid crystal display devices, but also can be widely applied to exposure apparatus for fabricating thin-film magnetic heads, imaging devices (CCD), reticles, or the like and to exposure apparatus for fabricating semiconductor devices in which a semiconductor device pattern is exposed onto a wafer.

Furthermore, a charged particle beam, such as an X-ray or an electron beam, can be used for a light source of an exposure illumination light in addition to light beams generated from an ultra high pressure mercury lamp (g beam (436 nm), h beam (404.7 nm), i beam (365 nm)), a KrF excimer laser (248 nm), an ArF excimer laser (193 nm), and an $F_2$ laser (157 nm). For example, thermoelectron-emitting lanthanum hexaborite ($LaB_6$) or tantalum (Ta) can be used as an electron gun in the case of using an electron beam. Furthermore, in the case of using an electron beam, a reticle R can also be used or a pattern can be directly formed on a wafer without using a reticle R. Alternatively, high frequency lasers such as a YAG laser or a semiconductor laser can also be used.

The magnification of the projection optical system PL may be of a 1× (unity) magnification type or of a reduction type or an enlargement type. Furthermore, when a ultraviolet pulse light such as an excimer laser is used, the projection optical system PL preferably is made from materials that transmit the ultraviolet pulse light such as fluorite, quartz, and the like instead of a glass material. When an $F_2$ laser or an X-ray is used, a dioptric system or a catadioptric system is used for the projection optical system (a reflective reticle R also is used), and if an electron beam is used, an electron optical system formed of an electron lens and a deflector is used for the projection optical system. Furthermore, of course, the optical path through which an electron beam passes is placed in a vacuum. Additionally, the invention also can be used with a proximity exposure apparatus that exposes a pattern of the reticle R onto a wafer W by contacting the reticle R and the wafer W (i.e., without using a projection optical system PL).

When linear motors (see, e.g., U.S. Pat. Nos. 5,623,853 and 5,528,118) are used for the substrate stage PST and the reticle stage RST, an air floating type linear motor using an air bearing or a magnetic floating type linear motor using a Lorentz force can be used. Additionally, the respective stages RST and PST can be a type that moves along guides or they can be a guideless type that does not have guides.

The driving mechanism of the stages RST and PST can use a planar motor that drives the respective stages RST and PST with an electromagnetic force and includes a magnet unit (permanent magnet) having a two-dimensional matrix of magnets facing an armature unit having a two-dimensional matrix of coils. In this case, one of the magnet unit and the armature unit can be connected to the stages RST and PST, and the other of the magnet unit and the armature unit can be arranged in the moving surface side (base) of the stages RST and PST.

Thus, the exposure apparatus 11 of this embodiment of the invention can be fabricated by assembling various subsystems including each structural element so as to maintain predetermined mechanical precision, electrical precision, and optical precision. In order to maintain the various precisions, before and after assembly, adjustment that accomplishes optical precision for the various optical systems, adjustment that accomplishes mechanical precision for the various mechanical systems, and adjustment that accomplishes electrical precision for the various electrical systems can be performed. An assembly process from various subsystems to an exposure apparatus includes mechanical connections, wiring connections of electrical circuits, piping connections of pressure circuits and the like among the various subsystems. Prior to the assembly process from the various subsystems to the exposure apparatus, of course, individual assembly processes for the various subsystems are available. After the assembly process for the various subsystems of the exposure apparatus is completed, overall adjustment is performed, and various precisions are maintained for the entire exposure apparatus. Furthermore, an exposure apparatus may be preferably manufactured in a clean room in which temperature, cleanliness, and the like is controlled.

Figure 13:
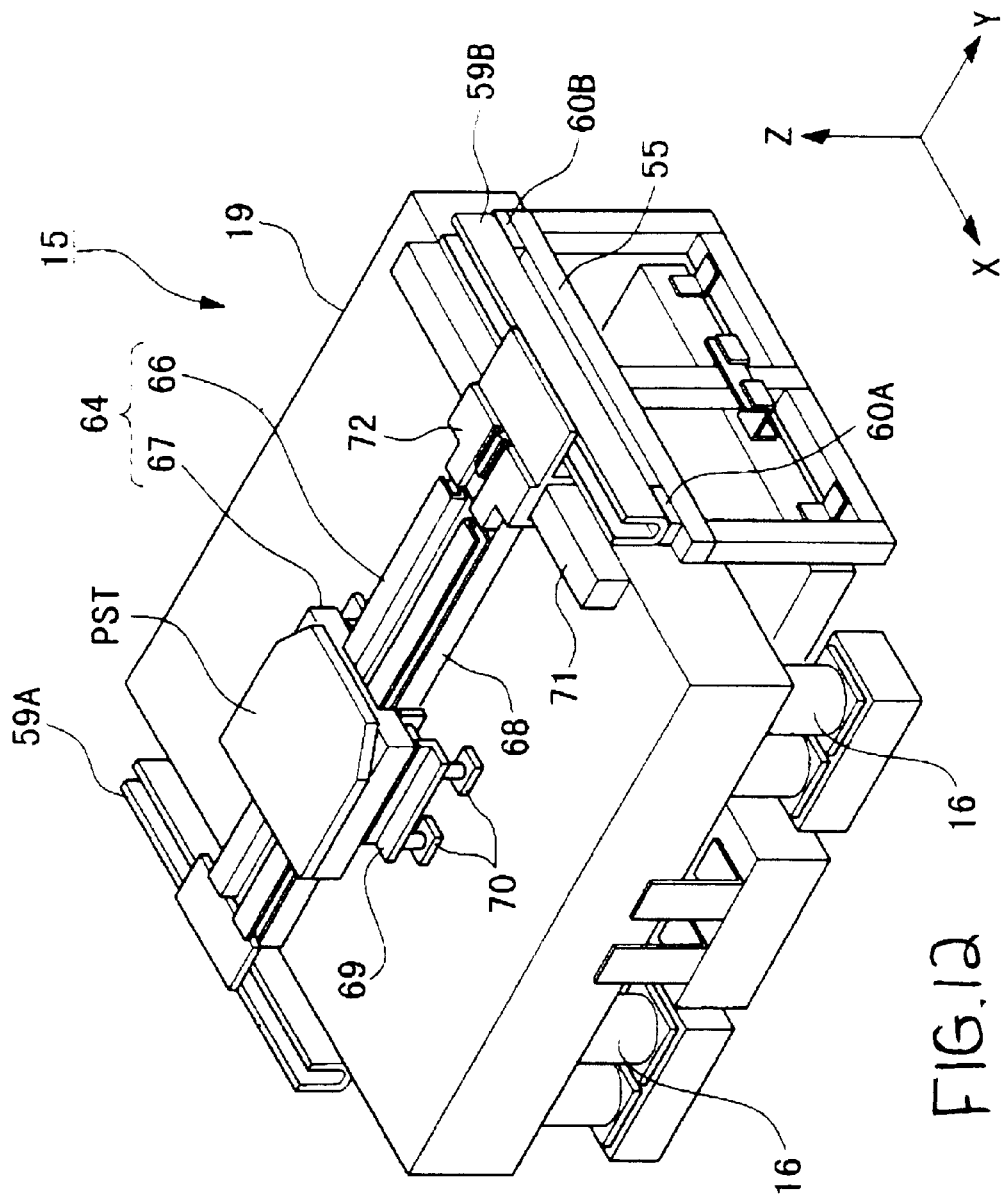
FIG. 13 is a flowchart showing one example of a process of manufacturing a liquid crystal display device.
Figure 13:
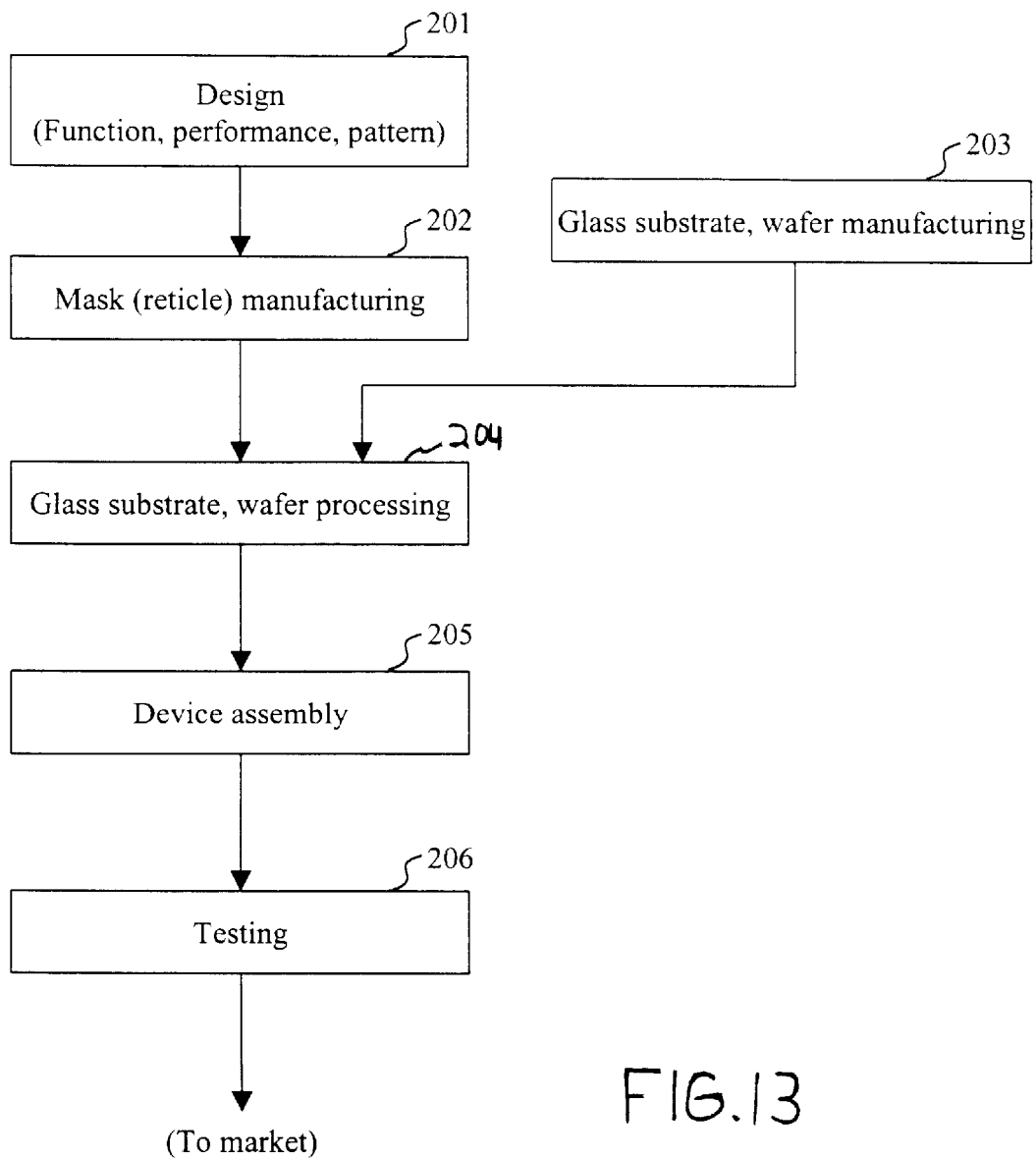

As shown in FIG. 13, a device such as a liquid crystal display device, a semiconductor device, or the like is manufactured by performing steps 201–206. In step 201, function-performance design for a liquid crystal display device or the like is performed. In step 202, a reticle R (mask) is manufactured based on the step 201 design step. In step 203, a glass substrate P formed of quartz or the like or a wafer formed of a silicon material is manufactured. In step 204, a pattern of the reticle R is exposed onto the glass substrate P (or wafer) using the scanning type exposure apparatus 11 of the above-mentioned embodiments. In step 205, the liquid crystal display device or the like is assembled (in the case of a wafer, a dicing process, a bonding process, and a packaging process are performed). Then, a testing step 206, or the like is performed.

As described above, the stage device according to one aspect of the invention detects a gap size between a movable part and a stationary part by using a detector and adjusts a relative positional relationship between the movable part and the stationary part based on the detected gap size.

Because of this, in this stage device, by using an inexpensive passive type vibration control system, even if a stage main body is inclined, contact between a movable part and a stationary part can be prevented, an expensive active type control device does not need to be used, the cost of the device can be reduced, and the number of arrangement•adjustment operations can be reduced. Therefore, while considering thrust rippling, position•speed control of the stage main body can be performed as expected, and deterioration of stage control performance can be prevented in advance.

By providing the detector on the movable part, the number of detectors can be minimized, the cost of the device can be reduced, and the number of adjustment operations of the detectors can be further reduced.

By having the positional adjustment device adjust the position of the stationary part, micro adjustment can be easier than the case when the position of several hundred kilos of stage main body is adjusted, and relative positional adjustment with high accuracy between movable and stationary parts can be performed.

By having the stationary part move in a direction perpendicular to the mounting surface of the stage main body on which a mounting object is mounted, in addition to adjustment of the gap size between the movable part and stationary part, adjustment of a focus position of a substrate also can be performed.

By providing the positional adjustment device with a rotary motor, a moving device that has a sloped surface and moves in a relative moving direction due to rotational driving, a roller that is provided on a stationary part and rolls on the sloped surface, and a controller that controls rotational driving based on the detection result of the detector, adjustment of the gap size between the stationary part and the movable part can be accomplished at low cost.

By having the controller perform feedback-control by using the rotational amount of the motor, rotational driving control with excellent stability and good responsiveness, that is, positional adjustment for the stationary part can be accomplished.

By having the detectors arranged corresponding to a plurality of movement directions of the stage main body, even if the base is two-dimensionally inclined, a posture of a stationary part is adjusted in the respective directions, and a gap size between the movable part and the stationary part can be maintained at a predetermined value.

The stage device can be used as at least one of the mask stage and the substrate stage. Thus, the cost of the device can be reduced, and the number of arrangement•adjustment operations can be reduced. At the same time, upon considering thrust rippling, position•speed control of the stage main body can be performed as expected, and deterioration of stage control performance can be prevented.

By integrally supporting the projection optical system, the mask stage, and the substrate stage, the mounting surface of the mask stage and the mounting surface of the substrate stage are maintained perpendicular to the optical axis of the projection optical system, so problems of the exposure processing can be prevented.

The movable and stationary parts between which the gap was maintained at a predetermined size need not be parts of the linear motor, as was illustrated in the drawings. For example, the movable and stationary parts could be specifically provided for use in measuring the gap. However, the illustrated embodiments, in which the gap between the movable and stationary parts of the linear motor is measured, is advantageous because it uses pre-existing parts (other than the detectors).

While the invention has been described with reference to preferred embodiments thereof, it is to be understood that the invention is not limited to the preferred embodiments or constructions. To the contrary, the invention is intended to cover various modifications and equivalent arrangements. In addition, while the various elements of the preferred embodiments are shown in various combinations and configurations, which are exemplary, other combinations and configurations, including more, less or only a single element, are also within the spirit and scope of the invention.

What is claimed is:

1. A stage device comprising:
    a stage main body that moves on a base and that has a mounting surface on which an object is mounted;
    a drive that drives the stage main body, the drive having a movable part disposed on the stage main body and a stationary part;
    a support that is vibrationally isolated from the base and that supports the stationary part, the movable part moving relative to the stationary part;
    a detector that detects a size of a gap between the movable part and the stationary part in a direction perpendicular to the mounting surface; and
    an actuator that adjusts a relative positional relationship between the movable part and the stationary part in the direction perpendicular to the mounting surface based on the detected gap size.

2. The stage device of claim 1, wherein the detector is disposed on the movable part.

3. The stage device of claim 2, wherein the actuator moves the stationary part in order to adjust the relative positional relationship between the stationary part and the movable part.

4. The stage device of claim 3, wherein the actuator moves the stationary part in the direction perpendicular to the mounting surface of the stage main body.

5. The stage device of claim 4, wherein the actuator comprises:
    a motor that rotates a drive shaft;
    a moving part that has a sloped surface with respect to a direction in which the actuator moves the stationary part, the moving part being movable in a direction perpendicular to the direction in which the actuator moves the stationary part and being coupled to the drive shaft so as to be driven in the perpendicular direction by the motor;
    a roller disposed on the stationary part and that moves on the sloped surface of the moving part; and
    a controller that controls the motor based on the gap size detected by the detector.

6. The stage device of claim 5, wherein the controller performs feedback-control by using a sensed rotational amount of the motor.

7. The stage device of claim 1, wherein the actuator moves the stationary part in order to adjust the relative positional relationship between the stationary part and the movable part.

8. The stage device of claim 7, wherein the actuator moves the stationary part in the direction perpendicular to the mounting surface of the stage main body.

9. The stage device of claim 8, wherein the actuator comprises:
    a motor that rotates a drive shaft;
    a moving part that has a sloped surface with respect to a direction in which the actuator moves the stationary part, the moving part being movable in a direction perpendicular to the direction in which the actuator moves the stationary part and being coupled to the drive shaft so as to be driven in the perpendicular direction by the motor;

a roller disposed on the stationary part and that moves on the sloped surface of the moving part; and a controller that controls the motor based on the gap size detected by the detector.

10. The stage device of claim 9, wherein the controller performs feedback-control by using a sensed rotational amount of the motor.

11. The stage device of claim 1, wherein:

the stage main body moves in a plurality of moving directions, including the relative moving direction; and the detector includes a plurality of sensors arranged corresponding to the plurality of moving directions.

12. The stage device of claim 1, wherein the drive is a linear motor, and the movable part and the stationary part are movable and stationary parts of the linear motor that drives the stage main body with respect to the base.

13. An exposure apparatus in which a pattern of a mask held by a mask stage is exposed onto a substrate held by a substrate stage, comprising:

a base that movably supports one of the mask stage and the substrate stage and that has a mounting surface on which one of the mask and the substrate is mounted;

a drive that drives the one of the stages, the drive having a movable part disposed on the one of the stages and a stationary part;

a support that is vibrationally isolated from the base and that supports the stationary part, the movable part moving relative to the stationary part;

a detector that detects a size of a gap between the movable part and the stationary part in a direction perpendicular to the mounting surface; and an actuator that adjusts a relative positional relationship between the movable part and the stationary part in the direction perpendicular to the mounting surface based on the detected gap size.

14. The exposure apparatus of claim 13, further comprising:

a projection optical system that projects the pattern on the mask onto the substrate;

wherein the projection optical system, the mask stage, and the substrate stage are integrally supported by a common frame having the base.

15. A method of manufacturing a device including a lithography process that performs exposure using the exposure apparatus of claim 13.

16. A stage device comprising:

a stage main body that moves in a plane that is parallel to a surface of a base;

a drive that drives the stage main body, the drive having a movable part disposed on the stage main body and a stationary part;

a reaction frame that is vibrationally isolated from the base and that supports the stationary part, the reaction frame receiving a reaction force that is generated due to a movement of the stage main body in the plane, the movable part moving relative to the stationary part;

a detector that detects a size of a gap between the movable part and the stationary part in a direction perpendicular to the plane in which the stage main body moves; and an actuator that adjusts a relative positional relationship between the movable part and the stationary part in the direction perpendicular to the plane in which the stage main body moves based on the detected gap size.

17. The stage device of claim 16, wherein the detector is disposed on the movable part.

18. The stage device of claim 17, wherein the actuator moves the stationary part in order to adjust the relative positional relationship between the stationary part and the movable part.

19. The stage device of claim 18, wherein the actuator moves the stationary part relative to the reaction frame.

20. The stage device of claim 18, wherein the actuator comprises:

a motor that rotates a drive shaft a moving part that has a sloped surface with respect to a direction in which the actuator moves the stationary part, the moving part being movable in a direction perpendicular to the direction in which the actuator moves the stationary part and being coupled to the drive shaft so as to be driven in the perpendicular direction by the motor a roller disposed on the stationary part and that moves on the sloped surface of the moving part; and a controller that controls the motor based on the gap size detected by the detector.

21. The stage device of claim 20, wherein the controller performs feedback-control by using a sensed rotational amount of the motor.

22. The stage device of claim 16, wherein the actuator moves the stationary part in order to adjust the relative positional relationship between the stationary part and the movable part.

23. The stage device of claim 22, wherein the actuator moves the stationary part relative to the reaction frame.

24. The stage device of claim 16, wherein:

the stage main body moves in a plurality of moving directions within the plane, including the relative moving direction; and the detector includes a plurality of sensors arranged corresponding to the plurality of moving directions.

25. The stage device of claim 16, wherein the drive is a linear motor, and the movable part and the stationary part are movable and stationary parts of the linear motor that drives the stage main body with respect to the base.

26. An exposure apparatus in which a pattern of a mask held by a mask stage is exposed onto a substrate held by a substrate stage, comprising:

a base that movably supports one of the mask stage and the substrate stage, the one of the stages moving in a plane that is parallel to a surface of the base;

a drive that drives the one of the stages, the drive having a movable part disposed on the one of the stages and a stationary part;

a reaction frame that is vibrationally isolated from the base and that supports the stationary part, the reaction frame receiving a reaction force that is generated due to a movement of the one of the stages in the plane, the movable part moving relative to the stationary part;

a detector that detects a size of a gap between the movable part and the stationary part in a direction perpendicular to the plane in which the one of the stages moves; and an actuator that adjusts a relative positional relationship between the movable part and the stationary part in the direction perpendicular to the plane in which the one of the stages moves based on the detected gap size.

27. The exposure apparatus of claim 26, further comprising:

a projection optical system that projects the pattern on the mask onto the substrate;

wherein the projection optical system, the mask stage, and the substrate stage are integrally supported by a common frame having the base.

28. A method of manufacturing a device including a lithography process that performs exposure using the exposure apparatus of claim 26.

29. A method of operating a stage device in which a stage main body moves on a base, the stage main body has a mounting surface on which an object is mounted, a drive has a movable part disposed on the stage main body and a stationary part to drive the stage main body, and a support that is vibrationally isolated from the base and that supports the stationary part, the movable part moving relative to the stationary part, the method comprising:

detecting a size of a gap between the movable part and the stationary part in a direction perpendicular to the mounting surface; and adjusting a relative positional relationship between the movable part and the stationary part in the direction perpendicular to the mounting surface based on the detected gap size.

30. The method of claim 27, wherein the gap size is detected by a detector that is disposed on the movable part.

31. The method of claim 30, wherein the adjusting step includes moving the stationary part in order to adjust the relative positional relationship between the stationary part and the movable part.

32. The method of claim 31, wherein the adjusting step includes moving the stationary part in the direction perpendicular to the mounting surface of the stage main body.

33. The method of claim 32, wherein the adjusting step includes controlling a motor that causes the movement of the stationary part to occur, and motor is controlled by performing feedback-control based upon a sensed rotational amount of the motor.

34. The method of claim 29, wherein the adjusting step includes moving the stationary part in order to adjust the relative positional relationship between the stationary part and the movable part.

35. The method of claim 34, wherein the adjusting step moves the stationary part in the direction perpendicular to the mounting surface of the stage main body.

36. The method of claim 34, wherein the adjusting step includes controlling a motor that causes the movement of the stationary part to occur, and motor is controlled by performing feedback-control based upon a sensed rotational amount of the motor.

37. The method of claim 29, wherein:

the stage main body moves in a plurality of moving directions, including the relative moving direction; and the detecting step includes detecting the size of the gap with a plurality of detectors arranged corresponding to the plurality of moving directions.

38. The method of claim 29, wherein the drive is a linear motor, and the movable part and the stationary part are movable and stationary parts of the linear motor that drives the stage main body with respect to the base.

39. The stage device of claim 1, wherein the movable part and the stationary part are not in contact with each other.

40. The exposure apparatus of claim 13, wherein the movable part and the stationary part are not in contact with each other.

41. The stage device of claim 16, wherein the movable part and the stationary part are not in contact with each other.

42. The exposure apparatus of claim 26, wherein the movable part and the stationary part are not in contact with each other.

43. An exposure apparatus in which a pattern of a mask held by a mask stage is exposed onto a substrate held by a substrate stage, comprising:

a projection system disposed between the mask and the substrate to project the pattern onto the substrate;

a base that movably supports one of the mask stage and the substrate stage, the one of the stages moving in a plane that is parallel to a surface of the base;

a drive that drives the one of the stages, the drive having a movable part connected to the one of the stages and a stationary part;

a frame that is vibrationally isolated from the base and that supports the stationary part;

a detector that detects a size of a gap between the movable part and the stationary part along an optical axis of the projection system; and a controller that controls the drive based on the detected gap size.

44. The exposure apparatus of claim 43, wherein the frame receives a reaction force that is generated due to a movement of the one of the stages in the plane.

45. The exposure apparatus of claim 43, wherein the movable part and the stationary part are not in contact with each other.

46. The exposure apparatus of claim 43, wherein the drive comprises a linear motor.

47. The exposure apparatus of claim 43, wherein the detector is disposed on the movable part.

48. The exposure apparatus of claim 43, wherein the projection system and the mask stage are integrally supported by a common frame having the base.

49. The exposure apparatus of claim 43, further comprising an actuator that adjusts a relative positional relationship between the movable part and the stationary part in direction parallel to the optical axis of the projection system based upon the detected gap size.

* * * * *